United States Patent [19]

Kappeler et al.

[11] Patent Number: 4,631,701

[45] Date of Patent: Dec. 23, 1986

[54] DYNAMIC RANDOM ACCESS MEMORY REFRESH CONTROL SYSTEM

[75] Inventors: Ronald P. Kappeler; Robert C. Hughes, both of Dayton, Ohio

[73] Assignee: NCR Corporation, Dayton, Ohio

[21] Appl. No.: 547,523

[22] Filed: Oct. 31, 1983

[51] Int. Cl.$^4$ .......................... G06F 12/16; G11C 7/00
[52] U.S. Cl. ..................................... 364/900; 365/222
[58] Field of Search ....................... 365/222, 228, 229; 364/200 MS File, 900 MS File; 371/62, 66

[56] References Cited

U.S. PATENT DOCUMENTS

| | | | |
|---|---|---|---|
| 3,684,897 | 8/1972 | Anderson et al. | 307/208 |
| 3,685,027 | 8/1972 | Allen et al. | 340/173 R |
| 3,737,879 | 6/1973 | Greene | 340/173 R |
| 3,796,998 | 3/1974 | Appelt | 340/173 DR |
| 3,846,765 | 11/1974 | De Vries | 340/173 DR |
| 4,079,462 | 3/1978 | Koo | 365/222 |
| 4,172,282 | 10/1979 | Aichelmann | 364/200 |
| 4,218,753 | 8/1980 | Hendrie | 364/900 |
| 4,313,180 | 1/1982 | Mochizuki | 365/229 |
| 4,328,566 | 5/1982 | Thaler | 365/222 |
| 4,332,008 | 5/1982 | Shima | 365/222 |
| 4,414,664 | 11/1983 | Greenwood | 364/200 |

OTHER PUBLICATIONS

IBM Technical Disclosure Bulletin, vol. 23, No. 4, Sep. 1980, pp. 1598-1601.

*Primary Examiner*—James D. Thomas
*Assistant Examiner*—Florin Munteanu

*Attorney, Agent, or Firm*—Wilbert Hawk, Jr.; Albert L. Sessler, Jr.; Richard W. Lavin

[57] ABSTRACT

A system and method are disclosed for automatically refreshing a dynamic random access memory (DRAM) under a plurality of different operational conditions of an associated processor. When the processor is normally executing instructions it generates active signals which enable a generator circuit to generate timing signals. A hidden refresh circuit uses status signals and a first part of these timing signals to generate a refresh pulse during an opcode fetch cycle of each instruction being executed by the processor. A control circuit uses each refresh pulse and a second part of the timing signals to generate a row refresh signal to refresh a row in the DRAM indicated by a row address from a counter and a row address clock to increment the counter to the next row to be refreshed by the following row refresh signal. When a keep alive circuit senses that the processor has not run for a preselected period of time due to the incircuit use of a piece of test equipment, it generates pulses to enable the hidden refresh circuit to cause the control circuit to periodically refresh the DRAM until after the processor starts running again. When a halt/power-down circuit senses that the processor is executing a HALT instruction, it forces the processor to branch off into a subroutine to execute a preselected number of instructions to refresh an associated number of rows before allowing the processor to return to its HALT instruction. This operation periodically repeats until the processor has completed its HALT instruction.

3 Claims, 15 Drawing Figures

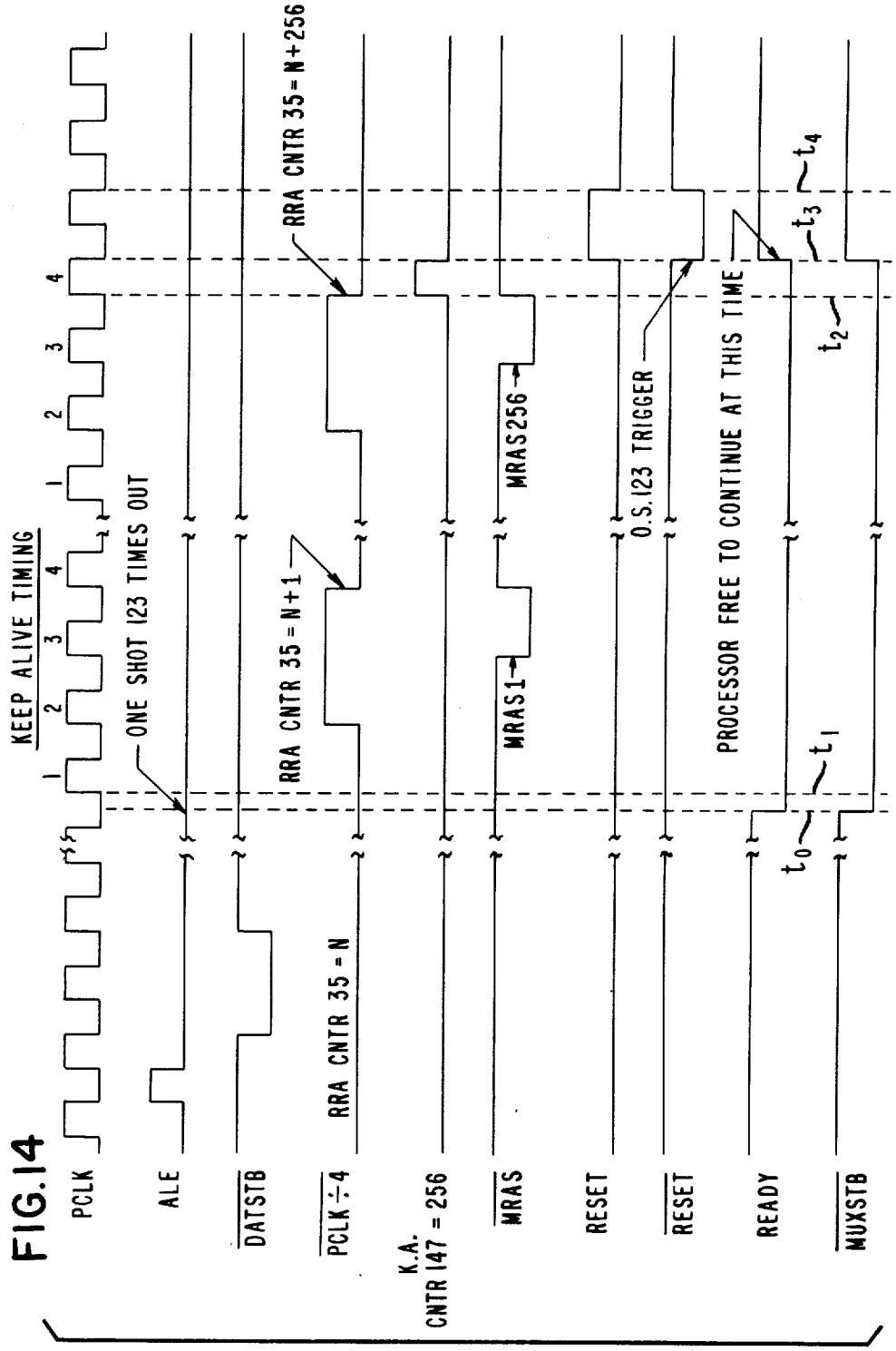

DYNAMIC RANDOM ACCESS MEMORY REFRESH CONTROL SYSTEM

BACKGROUND OF THE INVENTION

1. Field of the Invention

The present invention relates to the field of dynamic random access memories and more particularly to a control system for periodically refreshing such a memory under a plurality of different operational conditions.

2. Description of the Prior Art

Dynamic random access memories, (DRAM's) offer one of the lowest cost per bit alternatives to memory for microprocessor (or processor) based systems. However, a DRAM has some inherent characteristics associated with it which make it more difficult to use than other types of information storage devices.

Some of the problems associated with the use of DRAM's include: refresh requirements, de-selection prior to selection and multiplexing of address lines— row vs. column.

REFRESH REQUIREMENTS

Each memory cell in a DRAM consists of a transistor network and a capacitor. The transistors are used to charge the capacitor to store a "1" bit or to discharge the capacitor to store a "0" bit. Due to leakage, the memory cells must be refreshed periodically to keep the capacitors charged or discharged or else the integrity of the memory could not be relied upon. One common method of refreshing DRAM's is by a row refresh approach (referred to as a RAS/-only Refresh). It is necessary to refresh each row of memory in a DRAM within a time period of 2 to 4 ms (milliseconds). In order to accomplish this, there are two basic approaches which could be used. One is to stop the processor from executing its program and refresh all rows of memory. Another approach would be to interrupt the microprocessor every 2 to 4 ms and have it jump to a routine which would execute enough contiguous instructions to accomplish the memory refresh. Although both of these approaches have been successfully used in refreshing dynamic RAM's, both of them have an outstanding drawback. The use of either approach causes an interruption in the execution of the program. Such an interruption degrades the potential system throughput by perhaps as much as 10%.

DE-SELECTION PRIOR TO SELECTION

Another idiosyncrasy of a DRAM is that it must be de-selected for at least a specified amount of time prior to the selection or accessing of the DRAM. This time is called the precharge time. It is very important that this precharge time be maintained. If this precharge time is cut short at any time, all of the memory cells within the row or column currently latched at that time may have their contents changed, thereby destroying the integrity of the memory.

MULTIPLEXING OF ROW AND COLUMN ADDRESS LINES

Another difference between a DRAM and other types of memories which must be dealt with is that the memory cells in a DRAM are arranged in a row and column type of array and the row address lines are multiplexed with the column address lines.

The background art known to the applicants at the time of the filing of this application is as follows:

U.S. Pat. No. 3,685,027, Dynamic MOS Memory Array Chip, by C. A. Allen et al;

U.S. Pat. No. 3,684,897, Dynamic MOS Memory Array Timing System, by S. R. Anderson et al;

U.S. Pat. No. 3,796,998, MOS Dynamic Memory, by D. R. Appelt;

U.S. Pat. No. 3,846,765, Dynamic Cell Semiconductor Memory with Interlace Refresh;

U.S. Pat. No. 4,079,462, Refreshing Apparatus for MOS Dynamic RAMS, by J. T. Koo; and U.S. Pat. No. 4,218,753, Microcode-Controlled Memory Refresh Apparatus for a Data Processing System, by G. C. Hendrie.

SUMMARY OF THE INVENTION

Briefly, a dynamic random access memory control system is provided for causing a hidden refresh operation to be performed on a dynamic RAM when the associated microprocessor or processor is normally executing instructions and for selectively causing an associated one of several refresh operations to be performed on the dynamic RAM when the processor is in a halt condition, in a power-down condition, or not running due to the use of a logic analyzer, in-circuit emulator or other piece of test equipment.

In a preferred embodiment of the invention a memory refresh control system is coupled between a processor and a dynamic random access memory to refresh the memory under a plurality of different operational conditions. A generator circuit is responsive to signals from the processor for generating timing signals. Circuit means is responsive to state signals from the processor and to the timing signals for generating during an op-code fetch cycle of each instruction being executed by the processor a hidden refresh signal to refresh an associated row in the memory, a row address clock to increment a refresh row address counter to the address of the next row in the memory to be refreshed and a first state of a select signal to enable a multiplexer circuit to pass the row address from the counter to the memory. During each memory access period of the processor a second state of the select signal enables the multiplexer circuit to pass address signals from the processor to enable the memory to perform a memory access operation on data in the memory. A keep-alive circuit senses when the processor stops running for an abnormally long period of time and, in response to such stoppage, provides signals to enable the circuit means to periodically refresh the memory until after the processor starts running again. A halt/power-down circuit senses when the processor is in a halt condition and, in response to such halt condition, forces the processor to periodically branch off into a halt interrupt service routine. This routine causes the processor to execute instructions to examine the status of PFAIL/. Upon finding PFAIL/ to be high (which indicates that a power failure is not impending), the processor executes additional instructions to enable it to return to the halt instruction. Thus, this routine causes the processor to execute, for example, 8 instructions to refresh a corresponding 8 rows of memory each time the processor is forced to branch off into that routine. The halt/power-down circuit also includes circuitry which senses an impending power failure and, in response to such impending power failure, switches the system over to a back-up, power-down mode of operation, causes the multiplexer circuit to only pass row addresses from the counter to the memory and generates signals to enable the circuit means to continuously refresh the memory until after power is restored.

It is therefore an object of this invention to provide a novel memory refresh control system and method for refreshing a dynamic random access memory under a plurality of different operational conditions of an associated processor.

Another object of this invention is to provide a novel memory refresh control system and method for providing hidden refresh operations on a dynamic random access memory during the normal running of an associated processor.

Another object of this invention is to provide a novel memory refresh control system and method for providing refresh operations on a dynamic random access memory after the running of an associated processor has been stopped by the use of a logic analyzer, in-circuit emulator or other piece of test equipment.

Another object of this invention is to provide a novel memory refresh control system and method for sensing a halt condition in a processor and for forcing the halted processor to branch from the halt condition into a halt interrupt service routine to sequentially execute a number of instructions, causing a corresponding number of rows of memory in an associated dynamic random access memory to be refreshed, before returning the processor to the halt condition.

A further object of this invention is to provide a novel memory refresh control system and method for sensing an impending failure of power to a processor and for causing the system to switch over to a back-up, power-down mode of operation to continuously refresh an associated dynamic random access memory until after power is restored.

BRIEF DESCRIPTION OF THE DRAWINGS

These and other objects, features and advantages of the invention, as well as the invention itself, will become more apparent to those skilled in the art in the light of the following detailed description taken in consideration with the accompanying drawings wherein:

FIG. 14 illustrates waveforms useful in explaining the operation of the keep alive circuit of FIG. 1.

DESCRIPTION OF THE PREFERRED EMBODIMENT

It should be noted at this time that, throughout this description of the preferred embodiment, the presence of a slash (/) following either a symbol or an acronym represents the logical inversion of that symbol or acronym.

Figure 1A:
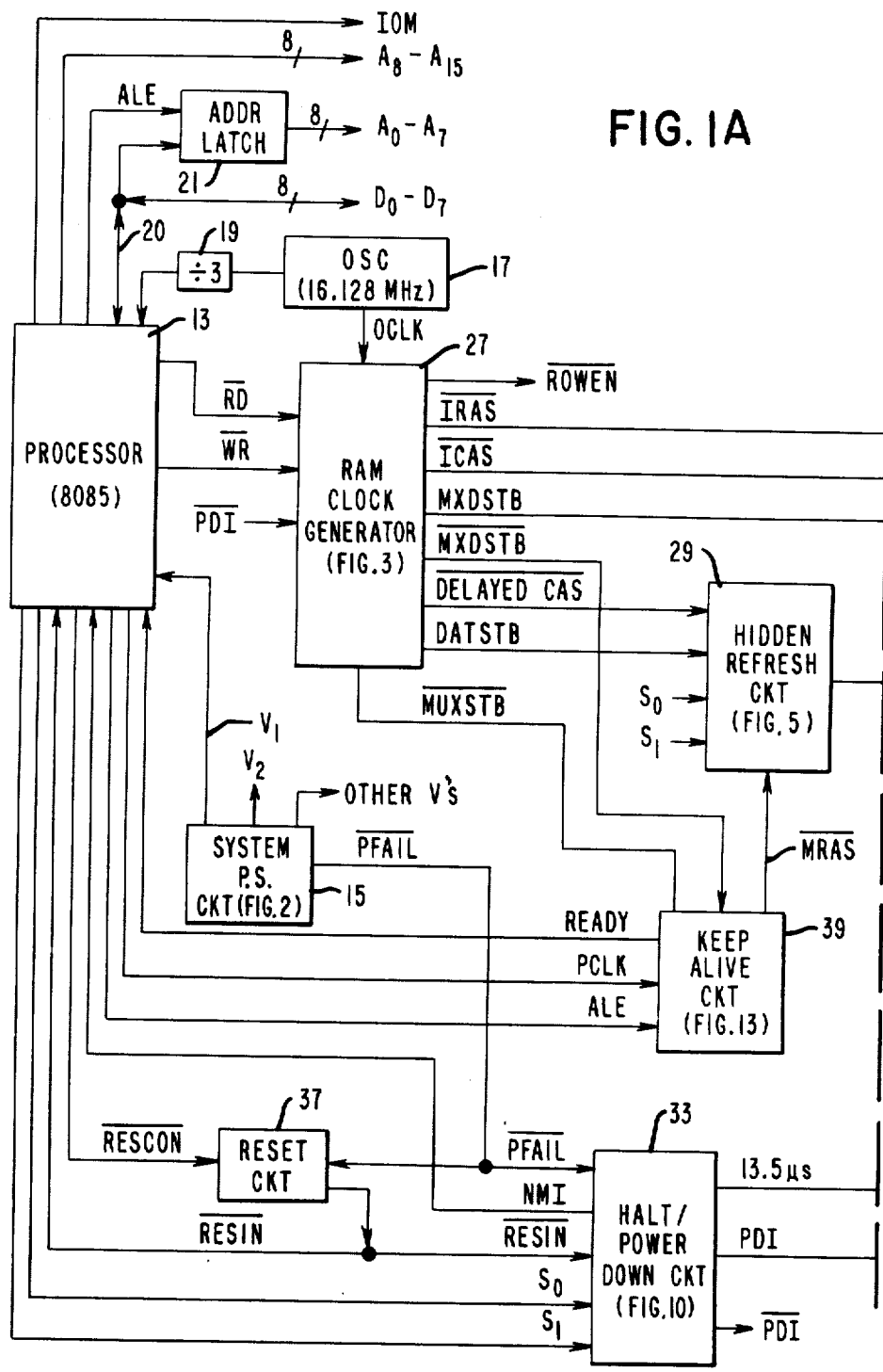
FIG. 1, which is comprised of FIGS. 1A and 1B, is a schematic block diagram of a preferred embodiment of the invention.
Figure 1B:
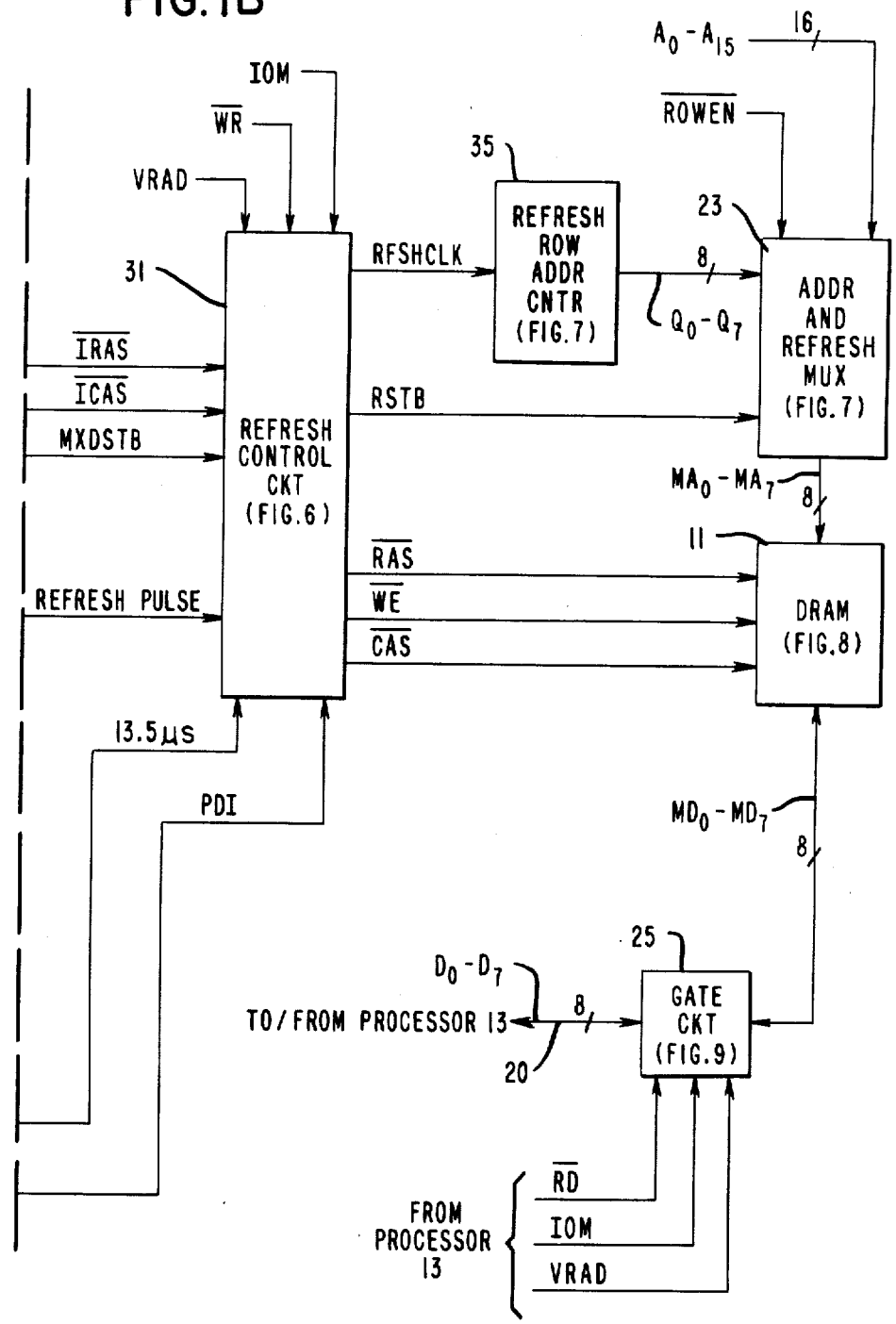

Referring now to the drawings, FIG. 1, which as stated before is comprised of FIGS. 1A and 1B, discloses a schematic block diagram of a preferred embodiment of the invention.

Basically, the invention is a control system for a dynamic random access memory (DRAM or dynamic RAM) 11 which provides one of several types of refresh operations to refresh the DRAM 11 as a function of the operational status of a microprocessor or processor 13. When the processor 13 is normally executing instructions, the control system provides a hidden refresh operation to the DRAM 11. When the processor 13 is in a halt condition, in a power-down condition or not running due to the use of a logic analyzer or piece of test equipment, the control system supplies an associated one of several other different types of refresh operations to periodically refresh the DRAM 11.

For purposes of this description, the processor 13 shown in FIG. 1 is an 8085 microprocessor manufactured by Intel, Santa Clara, Calif., and the DRAM 11 is comprised of eight, parallel-operated, Texas Instruments 4164 RAM's having maximum access times of 200 ns (nanoseconds). However, it should be realized that the invention could readily be adapted for use with a different type of microprocessor or processor 13 and/or a different type of DRAM 11 and that such other uses lie within the purview of the invention.

A system power supply circuit 15 supplies voltages $V_1$, $V_2$, and other V's to the circuitry shown in FIG. 1. While $V_1$ is supplied to most of the circuitry shown in FIG. 1, $V_2$ is only supplied to preselected portions of the circuitry shown in FIG. 1 (to be discussed). When the system power supply circuit 15 starts to fail, $V_1$ starts to decay. This causes the circuit 15 to output a low PFAIL/ signal to indicate a power failure and to go into a back-up, power-down mode of operation (to be explained). Upon the subsequent restoration of power, $V_1$ becomes +5 V and PFAIL/ goes high to enable the reset circuit 37 for power recovery.

A 16.128 MHz oscillator 17 supplies an OCLK (oscillator clock) to the system. The frequency of this OCLK is counted down by a divide-by-three ($\div 3$) circuit 19 to develop 5.376 MHz clocks. These 5.376 MHz clocks are, in turn, internally counted down by the 8085 microprocessor or processor 13 to develop a PCLK (processor clock) at a frequency of 2.688 MHz.

In operation, the processor 13 performs read and write operations upon the dynamic RAM 11 by executing instructions. Each instruction includes an opcode fetch cycle. The first cycle of an instruction to be executed is the opcode fetch cycle. An opcode fetch cycle is at least one PCLK or processor 13 clock cycle (to be explained) longer than that of any of the remaining cycles involved in the execution of an instruction. As will be explained in the discussion of FIGS. 3 and 4, this longer period of time of an opcode fetch cycle allows for a precharge period and a "hidden refresh" RAS/ pulse to be generated within the opcode fetch cycle. Thus, a row of memory in the DRAM 11 is refreshed with each instruction.

At the very beginning of a memory access cycle, the processor 13 applies a row address $A_0$–$A_7$ to the input of an address latch 21 by way of a data bus 20. The processor 13 also applies an ALE (address latch enable) pulse to the latch 21. On the trailing falling edge of ALE, after the input row address $A_0$–$A_7$ has stabilized, the row address $A_0$–$A_7$ is latched into the latch 21. After $A_0$–$A_7$ is latched into latch 21, data $D_0$–$D_7$ can be subsequently applied to the bus 20 from either the processor 13 during a write operation or the DRAM 11 during a read operation. Thus, the row address $A_0$–$A_7$ is demultiplexed off the data bus 20 before data $D_0$–$D_7$ is applied to the bus 20.

During a memory access cycle, the row address $A_0$–$A_7$ at the output of the latch 21 and a column address $A_8$–$A_{15}$ from the processor 13 are time division multiplexed through an address and refresh multiplexer 23 onto memory address lines $MA_0$–$MA_7$. A ROWEN/ (row enable) signal controls the switching of the multiplexer 23 such that $MA_0$–$MA_7$ first represents the row address $A_0$–$A_7$ and then represents the column address $A_8$–$A_{15}$. The row address and column address are respectively latched into associated latches (not shown) in the DRAM 11 to indicate the addressed location.

During a memory access cycle the processor 13 performs either a read operation or a write operation.

If a read operation is being performed during a memory access cycle, the processor 13 puts out the row address $A_0$–$A_7$ and column address $A_8$–$A_{15}$ and then a low RD/ (read) signal. This low RD/ signal causes memory data ($MD_0$–$MD_7$) to be strobed from the addressed location in the DRAM 11 through a gate circuit 25 onto the data bus 20 as data $D_0$–$D_7$. That data $D_0$–$D_7$ is then passed from the bus 20 into internal registers (not shown) of the processor 13 so that the processor 13 can process $D_0$–$D_7$.

If a write operation is being performed during a memory access cycle, the processor 13 puts out the row address $A_0$–$A_7$ and column address $A_8$–$A_{15}$ and then a low WR/ (write) signal. This low WR/ signal causes data $D_0$–$D_7$ on the data bus 20 to be strobed into the addressed location in the DRAM 11 via the gate circuit 25. Thus, the RD/ and WR/ signals determine the direction of flow of the data $D_0$–$D_7$ on the bus 20. Whichever one (but never both at the same time) goes low determines the direction of the data flow on the bus 20.

A RAM clock generator 27 is clocked by OCLK and is responsive to the generation of either a low RD/ pulse or a low WR/ pulse by the processor 13 for selectively outputting ROWEN/ (row enable), IRAS/ (intermediate row address strobe), ICAS/ (intermediate column address strobe), MXDSTB (multiplexer data strobe) and its negation MXDSTB/, DELAYED CAS/ (delayed column address strobe) and DATSTB- (data strobe) timing signals.

ROWEN/ is applied to a first multiplexer circuit (comprised of multiplexers 85 and 87 in FIG. 7) to control the switching between the row address $A_0$–$A_7$ and the column address $A_8$–$A_{15}$ from the processor 13. The reason why such switching is necessary is that dynamic RAM's, such as DRAM 11, are row and column address multiplexed.

State signals $S_0$ and $S_1$ from the processor 13 are utilized by a hidden refresh circuit 29 to detect when the processor 13 is going through an opcode fetch cycle. Both $S_0$ and $S_1$ are held high by the processor 13 during an opcode fetch cycle. When the hidden refresh circuit 29 detects an opcode fetch cycle from the high state signals $S_0$ and $S_1$, it uses the DATSTB and DELAYED CAS/ signals from the RAM clock generator 27 to generate a hidden refresh pulse which is outputted as a refresh pulse during the normal running of the processor 13.

A refresh control circuit 31 is selectively responsive to the refresh pulse from the hidden refresh circuit 29, the IRAS/, ICAS/ and MXDSTB signals from the RAM clock generator 27, VRAD (valid RAM address), WR/ (write) and IOM (input-output/memory) control signals from the processor 13, and a 13.5 μs (microsecond) clock and a PDI (power down indicator) signal from a halt/power-down circuit 33 for developing RAS/ (row address strobe or refresh signal), WE/ (write enable), CAS/ (column address strobe), RFSHCLK (refresh or address clock) and RSTB (refresh strobe) output signals. The refresh control circuit 31 controls these output signals from either an active access refresh mode or a power-down refresh mode.

In an active access refresh mode, RAS/, WE/ and CAS/ are used to refresh a row of memory in the DRAM 11 during an opcode fetch or hidden refresh cycle and to access data in the DRAM 11 during the subsequent memory access cycle. In addition, RFSHCLK is used to increment by one a refresh row address counter 35 to develop an output 8-bit row address $Q_0$–$Q_7$. This row address $Q_0$–$Q_7$ is the address of the next row in the DRAM 11 that is to be refreshed. Finally, RSTB selectively operates to control the switching of the address and refresh multiplexer 23 by sequentially passing the row address $A_0$–$A_7$ and column address $A_8$–$A_{15}$ to the DRAM 11 during a memory access cycle and by passing the refresh row address $Q_0$–$Q_7$ from the counter 35 to the DRAM 11 during a hidden refresh cycle.

In a power-down refresh mode, PDI goes high to force the refresh control circuit 31 into its back-up, power-down mode. In this mode the circuit 31 stops developing WE/ and CAS/ signals to protect the DRAM 11 against spurious WE/ and CAS/ transitions as the power is going down. In addition, the circuit 31 develops a high RSTB signal to force the address and refresh multiplexer 23 to only pass row addresses $Q_0$–$Q_7$ from the counter 35 to the memory address lines $MA_0$–$MA_7$ of the DRAM 11. Furthermore, the circuit 31 uses each input 13.5 μs clock to generate a RAS/ signal to refresh the row of the DRAM 11 pointed to by the row address $Q_0$–$Q_7$ and to then generate a RFSHCLK to increment the counter 35 to the next row of the DRAM 11 to be refreshed.

The halt/power-down circuit 33 operates under both halt and power-down conditions.

Keeping the DRAM 11 refreshed relies on keeping the processor 13 running so that the processor 13 goes through opcode fetch cycles. A hidden refresh on a row of memory in the DRAM 11 is performed by the system during each opcode fetch cycle. However, a program that the processor 13 is running may, under some circumstances, cause the processor 13 to execute a HALT instruction. In this case, the processor 13 would stop and its $S_0$ and $S_1$ state signals would both be low to indicate a HALT condition. The circuit 33 decodes the low states of $S_0$ and $S_1$ and issues a high NMI (non maskable interrupt) signal to the processor 13 to force the processor 13 out of the HALT instruction and into an interrupt service routine consisting of a sequence of instructions. The processor 13 performs an opcode fetch cycle in each instruction that it executes, thereby causing an associated row of memory in the DRAM 11 to be refreshed. In this manner several rows of the DRAM 11 are refreshed before the interrupt service routine is terminated and the processor 13 returned to the HALT instruction. This operation continues to be repeated to refresh the DRAM 11 until the processor 13 exits from the HALT condition.

In the operation of the system under a power-down condition, the output voltage $V_1$ of the system power supply circuit 15 would initially start to decay. This would cause the circuit 15 to apply a low PFAIL/ (power fail) signal to the halt/power-down circuit 33. In response to this low PFAIL/ signal, the circuit 33 applies a high NMI (non-maskable interrupt) signal to the processor 13. Once the processor 13 determines that the high NMI is caused by an impending power failure and not by a HALT condition, it prepares for this impending power failure by performing system-required, house-keeping chores while the power is going down. Upon finishing these chores the processor 13 generates a RESCON/ (reset control) signal. This RESCON/ signal fires a reset circuit 37, which may be a silicon controlled rectifier circuit (not shown), to develop a RESIN/ (reset in) signal to reset the processor 13. The RESIN/ signal also causes the halt/power-down circuit 33 to generate the PDI signal to force the refresh control circuit 31 into the power-down refresh mode of operation that was previously discussed.

A keep alive circuit 39 can be used by the system during debugging and software development work. When a logic analyzer, an in-circuit emulator or another piece of test equipment (not shown) is used in the system, the processor 13 may not run continuously. The test equipment being used may stop upon the execution of a certain address location in the DRAM 11. This common practice makes it difficult to keep the DRAM 11 refreshed using any type of software routine.

The keep alive circuit 39 has a preselected time out period. As long as the circuit 39 receives ALE pulses from the processor 13, the circuit 39 cannot time out. However, if the processor 13 stops running, it stops outputting ALE pulses (as well as RD/ or WR/ signals). In this case, the keep alive circuit 39 times out.

Upon timing out, the circuit 39 generates a low MUXSTB/ signal to prevent a memory access cycle from being generated by the RAM clock generator 27 and to cause the input address lines $MA_0$–$MA_7$ of the DRAM 11 to be switched to the output row address lines $Q_0$–$Q_7$ of the refresh row address counter 35.

After timing out, the keep alive circuit 39 also applies a sequence of MRAS/ pulses through the hidden refresh circuit 29 as a sequence of refresh pulses. This sequence of refresh pulses causes the refresh control circuit 31 to generate RFSHCLKs to increment the refresh row address counter 35 through a sequence of row addresses and to generate a sequence of associated RAS/ pulses to sequentially refresh all of the rows of memory in the DRAM 11 as the counter 35 steps through its row addresses.

The keep alive circuit 39 also applies a low READY signal to the processor 13 to further disable the processor 13 during the time that all of the rows in the DRAM 11 are being refreshed. Even if the logic analyzer or other piece of test equipment being used releases the processor 13 before this refreshing of all of the rows of the DRAM 11 is complete, the processor 13 will be held in a non-ready state by this low READY signal.

After all of the rows of the DRAM 11 have been refreshed, the address lines $MA_0$–$MA_7$ of the DRAM 11 will be switched back to the address lines $A_0$–$A_7$ and $A_8$–$A_{15}$ of the processor 13 so that the DRAM 11 can be normally accessed. If the logic analyzer, incircuit emulator or other test equipment has not released the processor 13 before the keep alive circuit 39 times out again, the above-described operation will be repeated.

Figure 2:
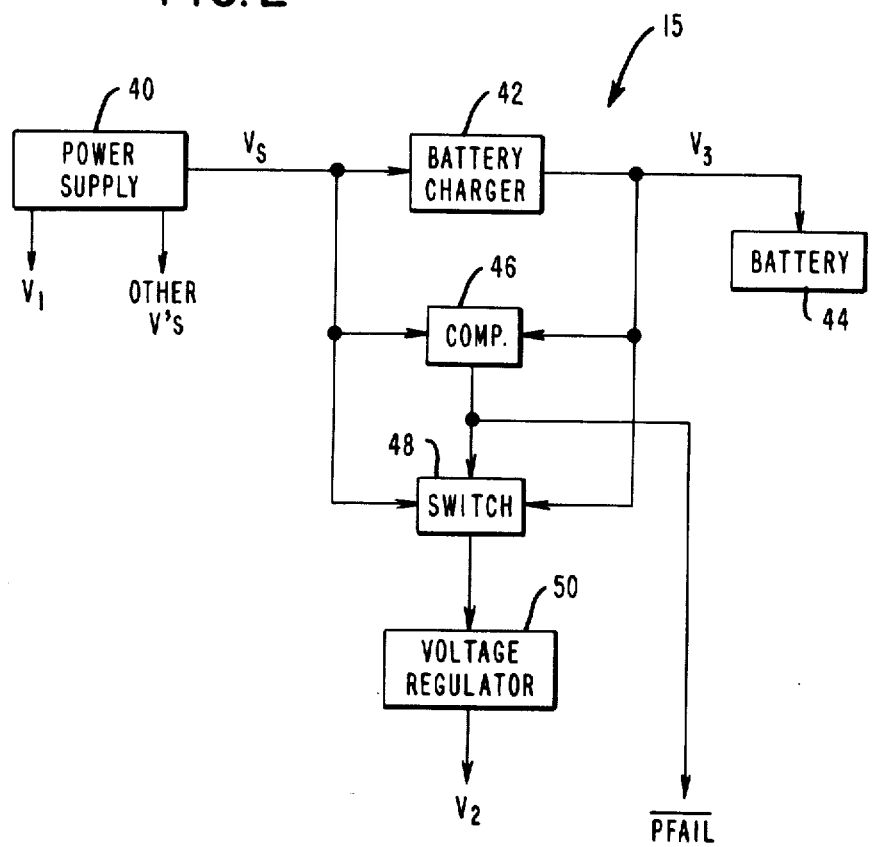
FIG. 2 is a schematic block diagram of the system power supply circuit of FIG. 1.

FIG. 2 illustrates a schematic block diagram of the system power supply circuit 15 of FIG. 1. As shown, a power supply 40 develops output voltages $V_1$ and $V_2$, as well as other output voltages (V's). The power supply 40 also supplies an internal voltage $V_S$ to a battery charger 42 to enable the battery charger 42 to keep a battery 44 charged up to a voltage $V_3$. Under normal conditions $V_1 = V_2$. For purposes of this description assume that $V_1 = V_2 = +5$ V (volts).

Both $V_S$ and $V_3$ are applied as inputs to a comparator 46 and to a switch 48. The switch 48 may be any suitable electronic or electro-mechanical switch. The comparator 48 compares $V_S$ to $V_3$. As long as $V_S$ is either equal to or greater than $V_3$, the comparator 48 outputs a high PFAIL/ (power fail) signal to enable the switch 48 to pass $V_S$ to a voltage regulator 50 to produce the output voltage $V_2$. However, when the power supply 40 starts to fail, the voltage $V_S$ starts to decay. This causes the comparator 46 to output a low PFAIL/ signal to indicate an impending power failure. This low PFAIL/ signal also causes the switch 48 to pass the battery voltage $V_3$ to the regulator 50 to supply the output voltage $V_2$.

The comparator 46 and switch 48 are both battery supported. It should be noted at this time that in subsequent places in this specification it is also mentioned that other circuit components are "battery supported." A battery supported component merely means that the voltage $V_2$ is supplied to that component instead of the voltage $V_1$. As explained above, during a back-up, power down condition, the voltage $V_3$ from the battery 44 is outputted through the regulator 50 as the voltage $V_2$. Thus, in effect, a battery supported component receives its voltage from the battery 44 during a power-down condition.

The RAM clock generator 27 shown in FIG. 3 will now be discussed in conjunction with the system timing waveforms shown in FIG. 4. Although PCLK, the processor clocks, are not utilized in the RAM clock generator 27, five exemplary PCLKs (PCLK1 through PLCK 4 and PCLK1) are shown in FIG. 4 to clarify the timing relationships of the waveforms of FIG. 4.

The RD/ and WR/ outputs from the processor 13 are applied to AND gate 41. It should be recalled that RD/ is driven to a low state by the processor 13 for the period of a read cycle, while WR/ is driven to a low state by the processor 13 for the period of a write cycle. If neither RD/ nor WR/ goes low, none of the previously mentioned outputs of the RAM clock generator 27 will go active. Consequently, no memory access cycle can occur unless either RD/ or WR/ goes low. Therefore, for purposes of the following discussion, assume that the processor 13 outputs either a low RD/ or a low WR/ signal at time $t_0$ to initiate a memory access cycle to access the dynamic RAM 11. Note that at time $t_0$ the RD/ or WR/ clock goes low substantially at the time of the falling edge of PCLK1. However, these signals are not necessarily synchronous with each other.

The low RD/ or low WR/ clock signal causes AND gate 41 to develop a low DATSTB/ (data strobe) signal which is inverted by inverter 43 to develop a high DATSTB signal. This high DATSTB signal is applied to one input of NAND gate 45. The MUXSTB/ signal from the keep alive circuit 39 is applied to a second input of NAND gate 45. In the normal operation of the processor 13, MUXSTB/ is high. As a result, the high MUXSTB/ and high DATSTB input signals cause the NAND gate 45 to produce a low MXDSTB/ signal, which is inverted by inverter 47 to produce a high MXDSTB output. The low MXDSTB/ signal is further used to enable a first input of each of OR gates 49, 51 and 53. The low MXDSTB/ signal is also passed through OR gate 55 to the input of a serial-to-parallel shift register 57. Register 57 is clocked with OCLK, the 16.128 MHz clock having a period of approximately 62 nanoseconds (ns).

Figure 4:
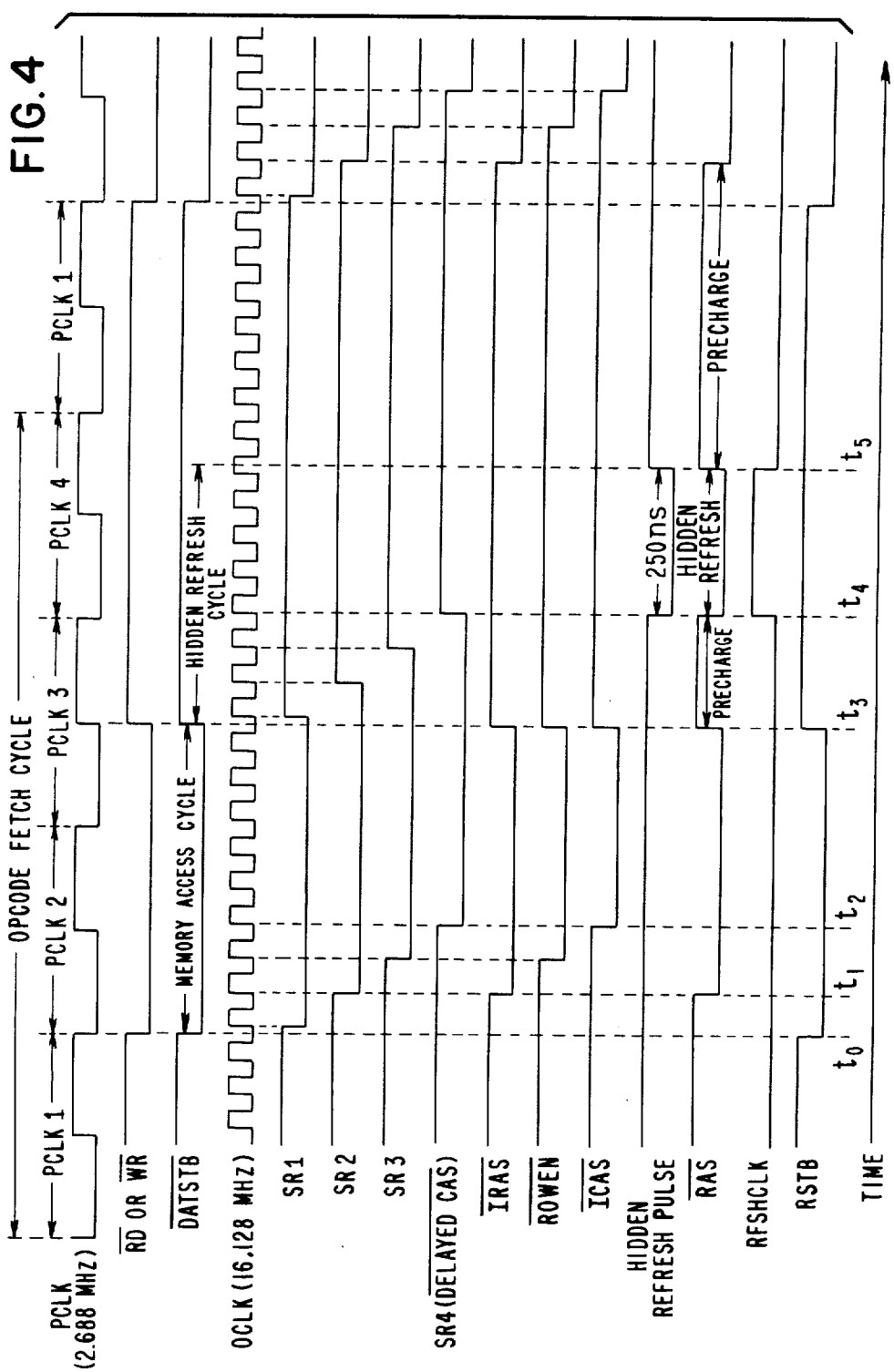
FIG. 4 illustrates waveforms useful in explaining the operation of the RAM clock generator of FIG. 1.

As can be seen in FIG. 4, while OCLK was used to derive PCLK, OCLK is not necessarily synchronized with PCLK, or even the clock RD/ or WR/. Also note that OCLK and DATSTB/, from which MXDSTB/ was derived, are not necessarily in synchronization with each other. However, it should be understood that a processor 13, other than the 8085 microprocessor, could have been used in the system of FIG. 1 to enable the system to provide mutually synchronous OCLK, PCLK, DATSTB/ and RD/ or WR/ signals.

The low MXDSTB/ signal that is gated through OR gate 55 is clocked through the shift register 57 on the rising edges of the OCLK clocks. This causes consecutive outputs SR1, SR2, SR3 and SR4 of the shift register 57 to go low at successive OCLK intervals of 62 ns each. The signals at the outputs SR2, SR3 and SR4 of shift register 57 are respectively applied to second inputs of the enabled OR gates 49, 51 and 53 to develop low IRAS/ ROWEN/ and ICAS/ signals, respectively. These IRAS/, ROWEN/ and ICAS/ signals are used to ultimately cause the row and column addresses to be strobed into the dynamic RAM 11 (to be explained). A low delayed CAS/ signal is also taken from the SR4 output of the register 57. The falling edge of this delayed CAS/ signal occurs at time $t_2$.

Processor 13 terminates the memory access cycle by causing the low one of the RD/ or WR/ signals to go high at time $t_3$. This causes the AND gate 41 to develop a high DATSTB/ signal.

When DATSTB/ is high, the RAM clock generator 27 is prevented from developing any of the indicated output signals therefrom. More specifically, when DATSTB/ goes high at time $t_3$, MXDSTB goes low and MXDSTB/ goes high. A high MXDSTB/ disables OR gates 49, 51 and 53, thereby causing IRAS/, ROWEN/ and ICAS/ to return to their inactive or high states at time $t_3$. However, the now high MXDSTB/ signal is clocked through the shift register 57 on the rising edges of the OCLK clocks to cause the SR1, SR2, SR3 and SR4 (or delayed CAS/) outputs of the register 57 to sequentially go high at 62 ns intervals.

As shown in FIG. 4, the delayed CAS/. signal at the SR4 output of register 57 does not go high until the time ($t_4$) of the rising edge of the fourth OCLK after DATSTB/ goes high. The time period $t_3$-$t_4$ can vary between 186 ns and 248 ns, depending upon the period of time between $t_3$ and the rising edge of the next OCLK after $t_3$. As will be explained later, the delayed CAS/ signal is used by the hidden refresh circuit to produce a hidden refresh pulse during the hidden refresh cycle portion ($t_3$-$t_5$) of an opcode fetch cycle.

When the system of FIG. 1 has a power-down situation, the halt/power-down circuit 33 (FIG. 10) generates a low PDI/ (power down indication) signal which resets a D-flip flop 59 so that its Q/ output goes high. This high signal from flip flop 59 is then passed through OR gate 55 and then clocked through shift register 57 to sequentially cause OR gates 49, 51 and 53 to respectively develop high IRAS/, ROWEN/ and ICAS/ signals. Thus, a low PDI/ prevents the normal accessing of the dynamic RAM 11 and also prevents the normal hidden refresh of the DRAM 11. In this event, as will be explained later, the halt/power-down circuit 33 (FIG. 10) furnishes a 13.5 μs (microsecond) signal which is applied to the refresh control circuit 31 (FIG. 6) to generate the signals necessary to refresh the DRAM 11 during the power-down operation. This operation can be called a power-down or back-up refresh mode of operation.

In the event that the system of FIG. 1 is returning to normal operation from such a power-down, back-up refresh mode of operation, the D-flip flop 59 is used to synchronize the operation of the processor 13 with the return from that power-down, back-up refresh mode of operation. After normal operation is restored, PDI/ goes high and removes the low reset from flip flop 59. Flip flop 59 then clocks a high voltage at its Q/ output on the rising edge of the next DATSTB/ that is generated after PDI/ goes high. This provides for that synchronization and also eliminates any conditions where either valid RAM access signals, such as IRAS/, ROWEN/ and ICAS/, or a power-up/power-down transition could occur midway between a memory access cycle.

It was stated above that the MUXSTB/ signal, applied to the NAND gate 45 from the keep alive circuit 39, is high during the normal operation of the processor 13. However, if for some reason the processor 13 stops processing data for a predetermined time, the keep alive circuit 39 will output a low MUXSTB/ signal and a low READY signal while it is generating a series of 256 low MRAS/. pulses to refresh the DRAM 11. This low MUXSTB/ signal disables NAND gate 45, thereby preventing low RD/ or WR/ signal from the processor 13 from causing the RAM clock generator 27 to produce a memory access cycle in the event that the keep alive circuit 39 is midway in its refresh operation. The low READY signal causes the processor 13 to wait by adding wait states to the cycle that the processor 13 tries to perform. Upon completion of the keep alive operation, the keep alive circuit 39 will cause READY and MUXSTB/ to go high to enable data processing to continue (to be discussed).

The remaining HIDDEN REFRESH PULSE, RAS/, RFSHCLK and RSTB waveforms in FIG. 4 will be discussed in relation to FIGS. 5 and 6.

Figure 5:
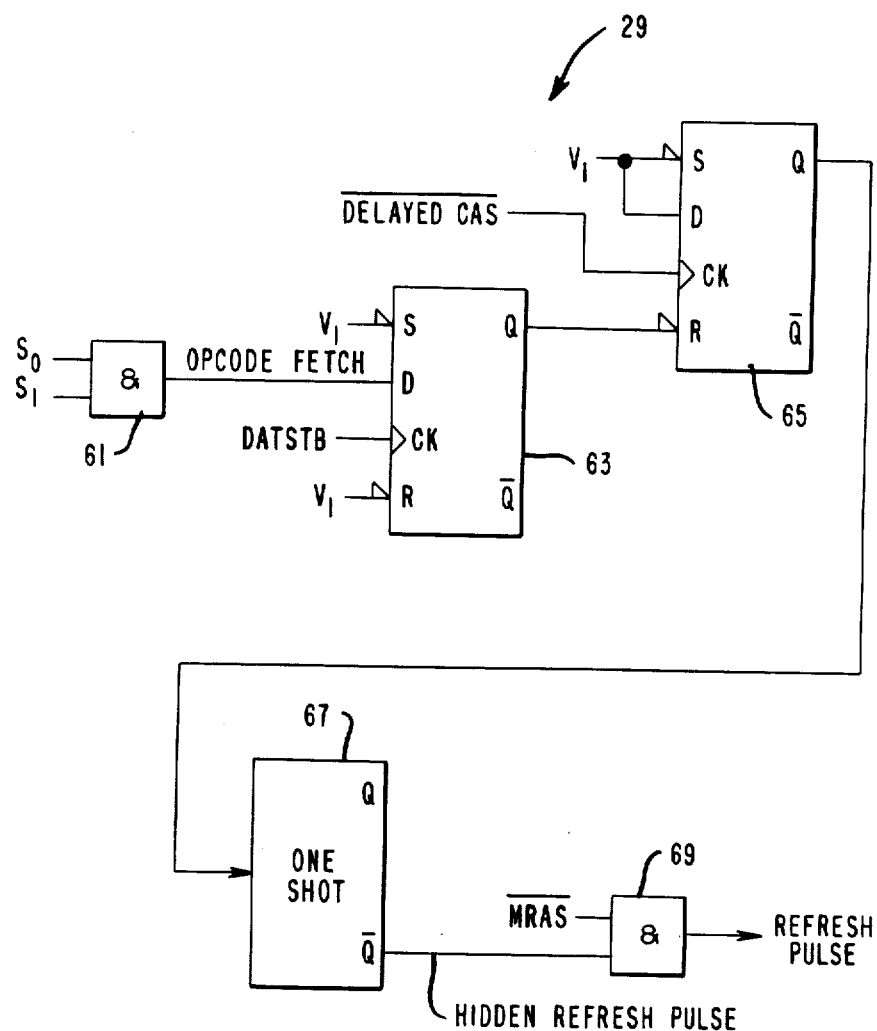
FIG. 5 is a schematic block diagram of the hidden refresh circuit of FIG. 1.

The hidden refresh circuit 29 as shown in FIG. 5. Status lines $S_0$ and $S_1$ from the processor 13 are applied to an AND gate 61 to enable the AND gate 61 to decode an opcode fetch cycle. Note, as shown in FIG. 4, that the opcode fetch cycle is 4 PCLK clock periods long, whereas a normal machine cycle is only 3 PCLK periods long. This longer period of an opcode fetch cycle provides sufficient time for a hidden refresh operation to occur during the hidden refresh cycle.

At the beginning of an opcode fetch cycle the processor 13 outputs high $S_0$ and $S_1$ status signals. These high $S_0$ and $S_1$ signals ar decoded by AND gate 61 to provide an output opcode fetch signal. This opcode fetch signal from AND gate 61 is fed into the data input of D-flip flop 63. In addition, the DATSTB signal from the RAM clock generator 27 is fed to the clock input of flip flop 63. When DATSTB goes high at the beginning of the memory access cycle of the opcode fetch cycle (time $t_0$), the high opcode fetch signal is clocked through the flip flop 63 to remove the low reset from D-flip flop 65.

As shown in FIG. 4, the delayed CAS/ signal from the RAM clock generator 27 goes high at time $t_4$, which is between 186 ns and 248 ns after IRAS/ goes high. This time period provides a sufficient precharge time period before a hidden refresh operation is commenced. Since the $V_1$ from the system power supply circuit 15 is applied to the data input of the flip flop 65, the rising edge of the delayed CAS/ signal causes the flip flop 65 to clock out a high-going signal to the input of a one-shot 67. The Q/ output from this one-shot 67 then produces a low hidden refresh pulse of approximately 250 ns in duration during the time period $t_4$–$t_5$, as shown in FIG. 4.

This low-going hidden refresh pulse is applied to one input of an AND gate 69. The MRAS/ signal from the keep alive circuit 39 is applied to a second input of AND gate 69. MRAS/ is used to produce refresh pulses in the event that the DRAM 11 is being maintained or refreshed by the keep alive circuit 39. However, in the normal operation of the processor 13, MRAS/ is high. Therefore, in normal operation, the low-going hidden refresh pulse is gated through AND 69 as a low refresh pulse.

If, for some reason, the processor 13 stops processing data for a predetermined time, it would not generate high $S_0$ and $S_1$ status signals and no hidden refresh pulses would be generated by the hidden refresh circuit. In this case, as stated before, the keep alive circuit 39 would generate a series of 256 low MRAS/ pulses. These low MRAS/ pulses would be gated through AND gate 69 as refresh pulses to refresh the DRAM 11.

The refresh control circuit 31 will now be described by referring to FIG. 6.

IRAS/ (from the RAM clock generator 27) and the refresh pulse (from the hidden refresh circuit 29) are applied to a NAND gate 71. As shown in FIG. 5, in normal operation with hidden refresh, when MRAS/ is high the hidden refresh pulse from one-shot 67 is passed out of the hidden refresh circuit 29 as the refresh pulse. Thus, NAND gate 71 operates to apply a high signal to the left side of an inverting multiplexer 73 whenever either IRAS/ (FIG. 4) goes low during a memory access cycle or the hidden refresh pulse (FIG. 4) goes low during a hidden refresh operation.

Inverter 75, OR gate 77 and NOR gate 79 collectively operate to only output a high signal from NOR gate 79 to the left side of the multiplexer 73 when the dynamic RAM 11 is actually being accessed during a memory write cycle. To accomplish this objective, VRAD is applied to the inverter 75, while WR/ and IOM are applied to OR gate 77. It should be recalled that: a high VRAD indicates that the dynamic RAM 11 is to be accessed, a low WR/ indicates a write cycle, and a low IOM indicates a memory operation instead of an input/output operation. Therefore, it is only when VRAD is high and both WR/ and IOM are low that the NOR gate 79 will apply a high output to the multiplexer 73.

The refresh pulse, which as stated before is the hidden refresh pulse during the normal operation of the processor 13, as well as the MXDSTB from the RAM clock generator 27, are also applied as inputs to the left side of the multiplexer 73.

A one shot 81 is clocked with a 13.5 μs free running clock (to be explained) from the halt/power down circuit 33. On the falling edge of the 13.5 μs clock, the one shot 81 produces a high going pulse BKRAS (back up RAS) and a low going pulse BKRAS/. BKRAS, BKRAS/ and two grounded connections are selectively inputted to the lower side of the multiplexer 73.

The four inputs to the left side of the multiplexer 73 are used during a power-up condition. On the other hand, the four inputs to the lower side of the multiplexer 73 are used in the back-up or power-down refresh mode of operation to initiate a pulse on the RAS/ line to the DRAM 11 and also to provide a refresh clock to increment the refresh row address counter 35.

The state of the power down indication signal PDI controls the switching operation of the multiplexer 73. In a normal power-up operation of the system, PDI is low. Conversely, during the time that the system has a power-down situation, PDI is high. When PDI is low, the output of the NAND gate 71, output of the NOR gate 79, the refresh pulse and the MXDSTB signal are respectively multiplexed to the output lines of the multiplexer 73 as the RAS/, WE/, RFSHCLK and RSTB signals. Similarly, when PDI goes low during a power-down situation, the BKRAS, ground, BKRAS/ and ground signals are respectively multiplexed to the output lines of the multiplexer 73 as the RAS/, WE/, RFSHCLK and RSTB signals in order to provide stable signals during the time that the power is down.

ICAS/ (from the RAM clock generator 27) and PDI are applied as inputs to an OR gate 83. When PDI is low (during a power up condition) ICAS/ (FIG. 4) is passed through the OR gate 83 as CAS/, with the falling edges of CAS/ being used for column address latching when PDI is high (during a power-down condition), the OR gate 83 provides a stable high CAS/ output power-down situations.

The outputs RAS/, CAS/ and WE/ of the refresh control circuit 31 are applied to the dynamic RAM 11 (FIG. 1). When the address lines MA$_0$–MA$_7$ (FIG. 1) of the dynamic RAM 11 are set up as a new row address, the high-to-low transition of RAS/ strobes the DRAM 11 to latch those 8 bits into an internal row address latch (not shown) of the DRAM 11. Similarly, when the address lines MA$_0$–MA$_7$ of the DRAM 11 are set up as a new column address, CAS/ strobes the DRAM 11 to latch those 8 bits into an internal column address latch (not shown) of the DRAM 11. If WE/ is high, the contents of the selected cell of the DRAM 11 that is pointed to by the row and column addresses latched in the DRAM 11 will be driven onto the data output lines MD$_0$–MD$_7$ (FIG. 1). If WE/ is low, the contents of the data lines MD$_0$–MD$_7$ will be written into the cell of the DRAM 11 that is pointed to by the row and column addresses that are latched in the DRAM 11.

The remaining outputs of the refresh control circuit are RFSHCLK and RSTB. RFSHCLK is used as a clock to increment the refresh row address counter 35 (FIG. 1) to a new row address. RSTB controls the address and refresh multiplexer 23 (FIG. 1) to selectively switch the multiplexer 23 back and forth from the input processor address lines $A_0$–$A_{15}$ to the input from the refresh row address counter 35.

The waveforms of the RAS/, RFSHCLK and RSTB signals are shown in FIG. 4 for a normal power-up operation having hidden refresh. In addition, it should be recalled that in the normal power-up operation ICAS/ is outputted from the refresh control circuit 31 as CAS/ and that the waveform of ICAS/ is also shown in FIG. 4.

Figure 6:
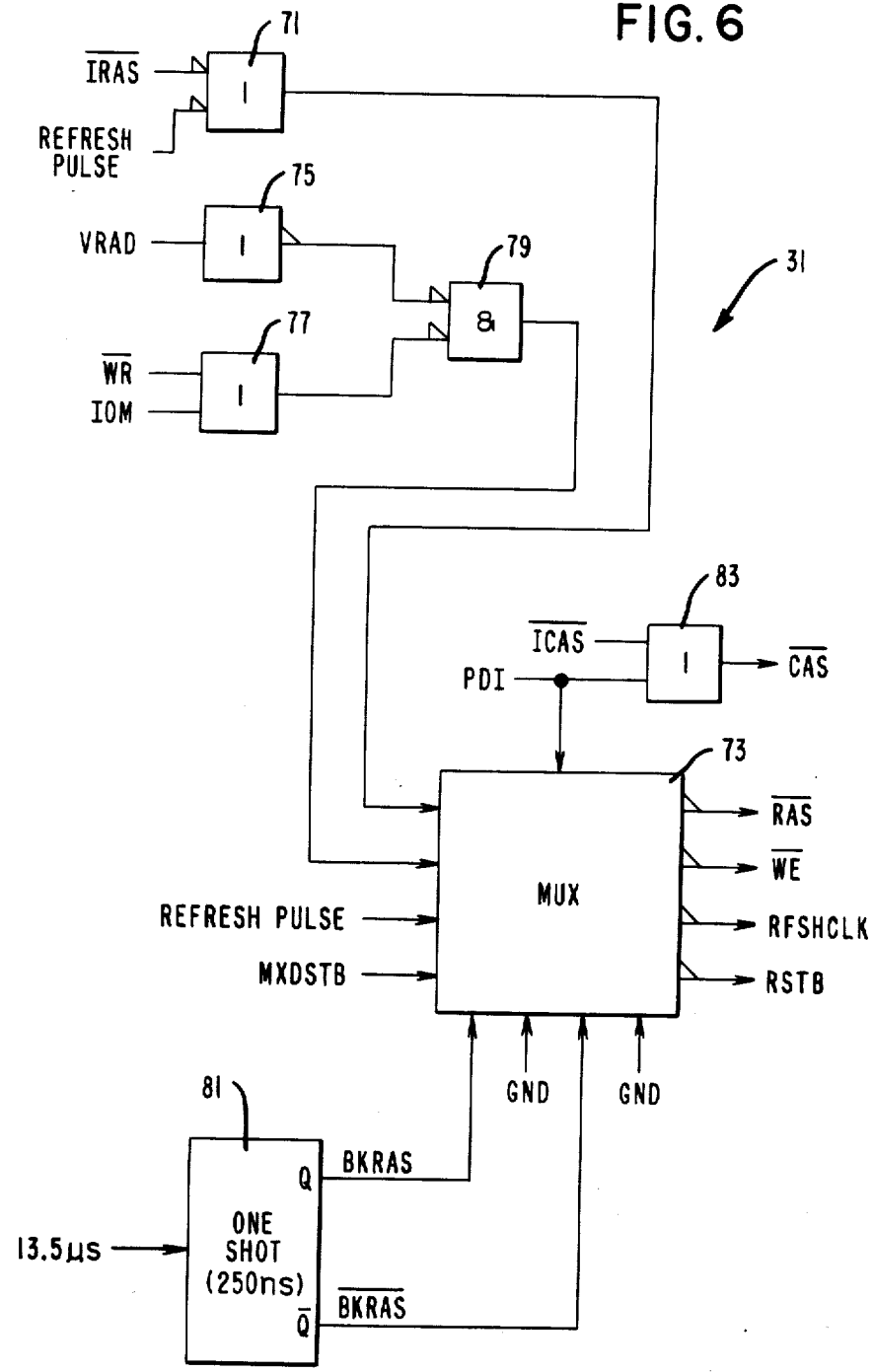
FIG. 6 is a schematic block diagram of the refresh control circuit of FIG. 1.

If a non-inverting multiplexer were to be used in lieu of the inverting multiplexer 73, it should be obvious that the circuit of FIG. 6 could readily be modified so that all of the inputs to multiplexer 73, except PDI, could be inverted to obtain the same polarities of outputs as described above and substantially shown in FIG. 4.

It should be noted at this time that the multiplexer 73, one shot 81 and OR gate 83 in FIG. 6 are battery supported devices and, therefore, can be relied upon to produce consistent outputs even when the system power supply circuit 15 (FIG. 1) fails.

The refresh row address counter 35 (FIG. 1) and address and refresh multiplexer 23 (FIG. 1) will be discussed in more detail by now referring to FIG. 7.

Refresh row address counter 35 is a 9-bit counter which is incremented by the falling edge of the refresh or address clock RFSHCLK to step through refresh row addresses 0 through 255 on output lines $Q_0$–$Q_7$ of the counter 35. The counter 35 is reset to 0 each time that the row address count reaches 256 (output bit $Q_8$ goes high).

The address and refresh multiplexer 23 is basically comprised of two sets of multiplexers. One set includes multiplexers 85 and 87, which are controlled in operation by ROWEN/ (from the RAM clock generator 27). When ROWEN/ is high during a first part of a memory access cycle, the multiplexers 85 and 87 cooperate to pass the processor row address $A_0$–$A_7$ onto their output lines $M_0$–$M_7$. When ROWEN/ is low during a second part of a memory access cycle, the multiplexers 85 and 87 cooperate to pass the processor column address $A_8$–$A_{15}$ onto their output lines $M_0$–$M_7$. The other set includes multiplexers 89 and 91, which are controlled in operation by RSTB (from the refresh control circuit 31). When RSTB is low during a memory access cycle (time period $t_0$–$t_3$ in FIG. 4), the multiplexers 89 and 91 cooperate to pass the time-division-multiplexed processor row and column addresses on lines $M_0$–$M_7$ onto the DRAM 11 address lines $MA_0$–$MA_7$. When RSTB is high during a hidden refresh cycle (time period $t_3$–$t_5$ in FIG. 4), the multiplexers 89 and 91 cooperate to put the refresh row address $Q_0$–$Q_7$ onto the address lines $MA_0$–$MA_7$ of the DRAM 11.

It should be noted that the refresh row address counter 35 and the multiplexers 89 and 91 are also battery supported devices and therefore can be relied upon to produce consistent outputs even when the system power supply 15 (FIG. 1) fails.

Figure 8:
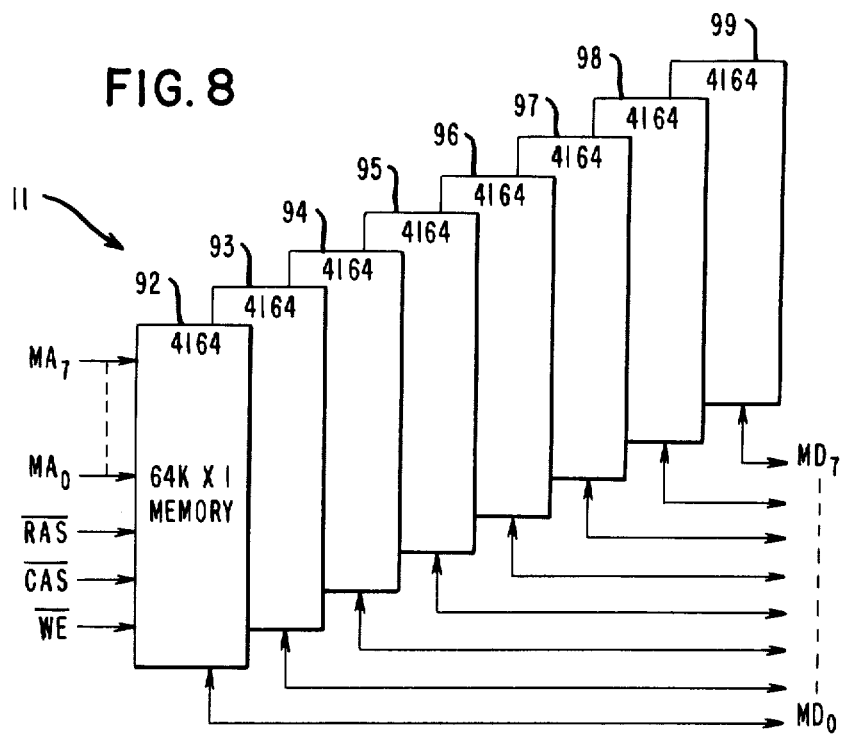
FIG. 8 is a schematic block diagram of the DRAM of FIG. 1.

Referring now to FIG. 8, the dynamic RAM 11 is shown comprised of a bank of eight battery-supported, dynamic RAMs 92-99, each of which is 1 bit wide and 64K bits in size. Each of these RAMs 92-99 may be a Texas Instruments 4164 type RAM, which has 256 rows and 256 columns to form 64,536 memory cells. Each of these cells stores 1 bit of data. The eight RAMs 92-99 are operated in parallel so that the dynamic RAM 11 can store 64K (65,536) bytes of data.

Memory address lines $MA_0$–$MA_7$, RAS/, CAS/ and WE/ are inputs to each of the RAMs 92-99, whereas data lines $MD_0$–$MD_7$ are respectively connected to the RAMs 92-99.

The dynamic RAM 11 is accessed by the eight address lines $MA_0$–$MA_7$ which are selectively multiplexed between row and column addresses, as discussed before. When the address lines $MA_0$–$MA_7$ are set up as the row address, then the DRAM 11 is strobed by RAS/ to latch the eight row address bits ($A_0$–$A_7$ during a memory access cycle or $Q_0$–$Q_7$ during a memory refresh cycle) into an internal latch (not shown) of the DRAM 11. Likewise, when the address lines $MA_0$–$MA_7$ are set up as the column address ($A_8$–$A_{15}$ during a memory access cycle), then the DRAM 11 is strobed by CAS/ to latch the eight column addres bits into another internal latch (not shown) of the DRAM 11.

During a memory access cycle, the latched row and column addresses then point to a particular one of the 64K, 1-byte wide memory cells or locations within the DRAM 11. If WE/ is strobed high, then the data byte stored in the addressed memory location (that the column and row addresses have pointed to) will be read out of the DRAM 11 onto the memory data lines $MD_0$–$MD_7$. On the other hand, if WE/ is strobed low, then the data on the memory data lines $MD_0$–$MD_7$ will be written into the addressed data byte location of the DRAM 11.

Whenever the refresh signal RAS/ goes low, the row of the DRAM 11 identified by the row address lines $MA_0$–$MA_7$ is refreshed. As shown in FIG. 4, RAS/ goes low at time $t_1$ during a memory access cycle or at time $t_4$ during a hidden refresh operation.

The dynamic RAM 11 is coupled to the gate circuit 25, which will now be discussed more fully by referring to FIG. 9.

It will be recalled that the gate circuit 25 prevents the DRAM 11 from being accessed by the processor 13 when the processor 13 is in an I/O (input/output) mode of operation to access an I/O device (not shown) or when the processor 13 is accessing data in ROM (not shown).

Figure 9:
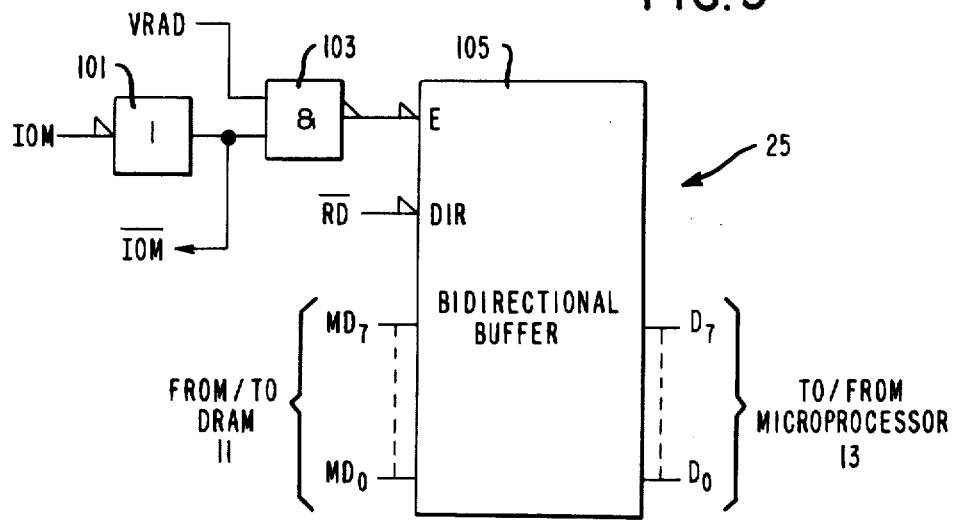
FIG. 9 is a schematic block diagram of the gate circuit of FIG. 1.

As shown in FIG. 9, the IOM (input/output-memory) signal from the processor 13 is inverted by inverter 101 before being applied to a lower input of NAND gate 103. The VRAD (valid RAM address) signal from the processor 13 is applied to an upper input of the NAND gate 103. The output of NAND gate is applied to an enable (E) input of a bidirectional buffer 105, which may be a Texas Instruments 74LS245 type Universal Bidirectional Bus Driver Integrated Circuit.

Memory data lines $MD_0$–$MD_7$ from the dynamic RAM 11 are connected to the left side of the buffer 105, while data lines $D_0$–$D_7$ from the processor (or microprocessor) 13 are connected to the right side of the buffer 105.

The operation of the bidirectional buffer 105 is controlled by the states of IOM, VRAD and RD/. When IOM is high, the processor 13 is in an input/output operation. When IOM is low, the processor 13 is performing a memory access operation. When VRAD is low, the processor 13 is accessing data in ROM (not shown). When VRAD is high, a valid RAM address is indicated. The bidirectionality of the buffer 105 is determined by the state of RD/.

If either VRAD is low or IOM is high, the high output of NAND gate 103 disables the buffer 105. However, if VRAD is high and IOM is low, the buffer 105 is enabled by the low output of NAND gate 103. When the buffer 105 is enabled, data from the DRAM 11 is placed on the data lines $D_0$–$D_7$ to the processor 13 when RD/ is low or data from the processor 13 is placed on the memory data lines $MD_0$–$MD_7$ to the DRAM 11 when RD/ is high.

Figure 10:
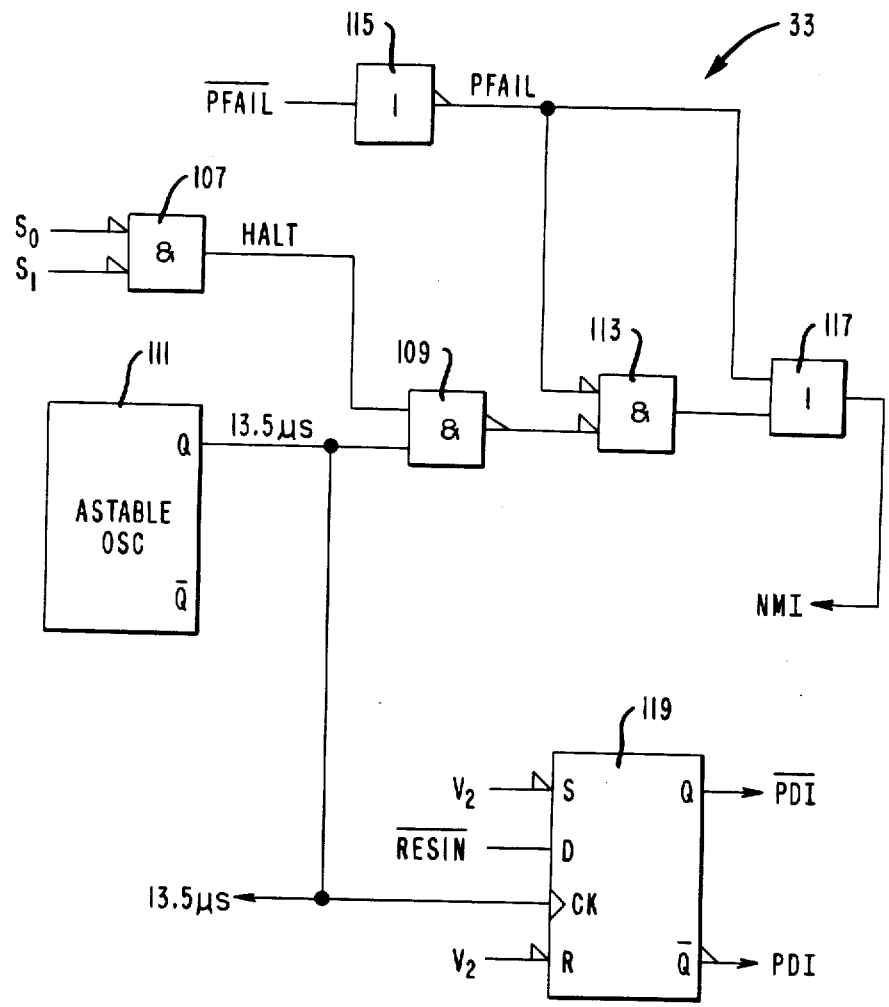
FIG. 10 is a schematic block diagram of the halt/power-down circuit of FIG. 1.

Referring now to FIG. 10, the illustrated halt/power circuit 33 has the capability for controlling the refreshing of the dynamic RAM 11 under two different operational conditions—a halt condition and a power-down condition. For ease of understanding, each of these conditions will be discussed separately.

HALT CONDITION

The above-described hidden refresh operation requires that the processor 13 run and continue to execute instructions. Each of these instructions contains an opcode fetch cycle. Each opcode fetch cycle causes one hidden refresh cycle. In this manner, a hidden refresh operation would be performed on one row of memory in the DRAM 11 for each instruction. However, the processor 13, which for the purposes of this description is an 8085 microprocessor, (as well as many other microprocessors or processors) has halt instructions which are used frequently in interrupt driven modes. Upon receiving a halt instruction, the processor 13 will go into a halt or idle condition and will not execute any further instructions, unless some peripheral (not shown) interrupts the processor 13 and forces it to move from its halt condition to an interrupt service routine. In such a case, the processor 13 may be stopped for a relatively long period of time. However, dynamic RAMs are implemented such that they require being completely refreshed every 2 to 4 milliseconds (ms). Therefore, it would not take very long to destroy the integrity of the dynamic RAM 11 if the processor 13 stopped for 8 or 10 milliseconds. Such a time period would be unnoticeable to any human interfaces. Thus, the first problem dealt with by the halt/power down circuit 33 is to enable the system of FIG. 1 to continue refreshing the DRAM 11 after the processor 13 executes a halt instruction.

The status lines $S_0$ and $S_1$ from the processor 13 are applied to the inputs of NOR gate 107. Upon executing a halt instruction, the processor 13 causes both $S_0$ and $S_1$ to go low. These low $S_0$ and $S_1$ signals are decoded by NOR gate 107 to develop a high HALT condition signal. This high HALT signal enables NAND gate 109 to invert and pass the 13.5 μs period clocks of astable oscillator 111 to a first input of NOR gate 113.

Even though the processor 13 is in a halt condition, the processor 13 is still in an operational (power-up or power normal) mode and not in a power-down mode. Therefore, PFAIL/ and RESIN/ both remain high.

The high PFAIL/ from the system power supply circuit 15 is inverted by an inverter 115 to develop a low PFAIL signal which enables the NOR gate 113 and an OR gate 117. As a result, the 13.5 μs clocks from NAND gate 109 are inverted by NOR gate 113 and then passed through OR gate 117 to the non maskable interrupt (NMI) line to the processor 13. Each positive transition at the output of OR gate 117 is an NMI signal.

Upon receiving a high NMI signal from the halt/power-down circuit 33, the processor 13 saves the current contents of the program counter (not shown) on a return stack (not shown), then enters an interrupt service routine. Opcode fetches will be issued during the performance of this interrupt service routine, causing the HALT signal to go low. During this interrupt service routine the processor 13 looks at the state of PFAIL/. Since either an impending power failure (a low PFAIL/) or a halt condition (a high HALT) can cause the halt/power-down circuit to produce a high NMI signal, the processor 13 initially determines what caused the high NMI. If PFAIL/ were low, an impending power failure would be determined. However, since it was stated that the processor 13 was in a halt condition, PFAIL/ is high. This high PFAIL/ signal indicates to the processor 13 that power has not failed and that the high NMI signal was caused by a halt condition sensed by the halt/power-down circuit 33.

When the processor 13 determines that the high NMI signal was caused by the halt condition and not by an impending power failure, it completes the remainder of the interrupt service routine which causes it to decrement its return address so as to point to the halt instruction that it had previously executed. The processor 13 will have executed, for example, 8 instructions in the interrupt service routine before it does a return to the original HALT instruction.

Each time that the processor 13 executes an instruction in the interrupt service routine, a row of memory in the DRAM 11 is refreshed. Thus, in executing the exemplary 8 instructions in the interrupt service routine, the processor 13 causes 8 rows in the DRAM 11 to be refreshed before the processor 13 halts again. Each subsequent time that a 13.5 μs clock occurs while the processor 13 is halted, the halt/power-down circuit 33 issues another NMI to cause the processor 13 to jump from the halt condition into the interrupt service routine and thereby refresh the next 8 rows of the DRAM 11 before returning to the halt instruction as discussed above.

As stated above, RESIN/ is also high during a halt condition, since the processor 13 is still in an operational (power-up) mode. The high RESIN/ signal is applied to the data input of flip flop 119. This flip flop 119 latches the high state of RESIN/ with the high-going edge of the 13.5 μs clocks from oscillator 111 to develop high PDI/ and low PDI outputs. As mentioned before, a low PDI enables the multiplexer 73 (FIG. 6) to pass normal power-up signals to its output RAS/, WE/, RFSHCLK and RSTB lines.

POWER-DOWN CONDITION

A power-down situation or condition can also destroy the integrity of a dynamic RAM, since it could prevent the dynamic RAM from being completely refreshed every 2 to 4 ms. The following discussions describe how the halt/power-down circuit 33 causes the system to go into a back-up or power-down operation to refresh the DRAM 11 during a power normal to power down situation and to go from a backup mode to the normal access mode during a power down to power normal situation.

FIG. 1 and the waveforms shown in FIGS. 11 and 12 will also be referred to in the following discussions.

Figure 11:
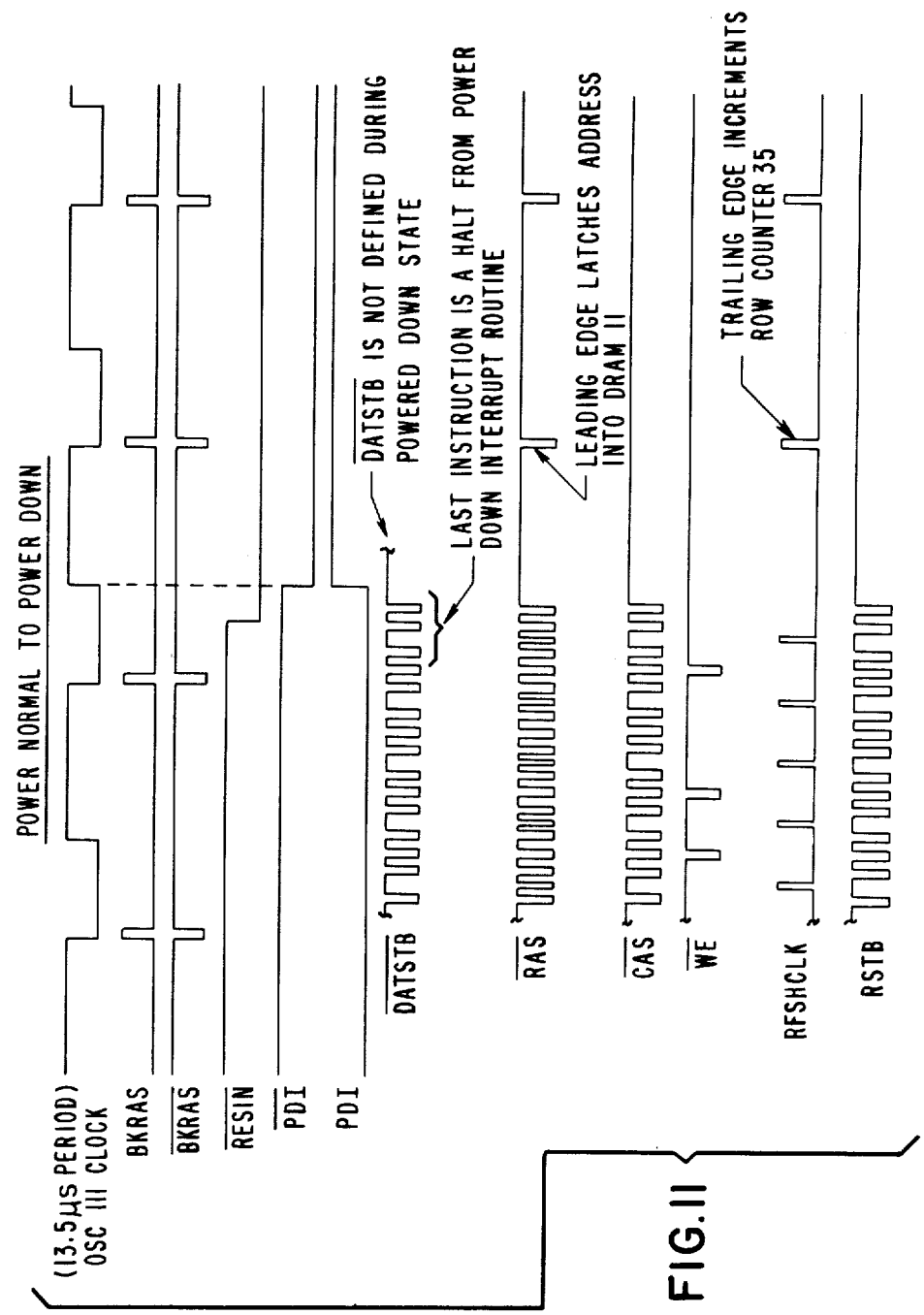
FIGS. 11 and 12 illustrate waveforms useful in explaining the operation of the halt/power-down circuit of FIG. 1.

FIG. 11 will be initially referred to during the discussion on the operation of the halt/power-down circuit 33 from a power normal to a power-down condition. Then FIG. 12 will be referred to during the discussion on the operation of the halt/power-down circuit 33 from a power down to a power normal condition.

Power Normal To Power Down

When there is a power interruption or power failure of the system power supply circuit 15, the system power supply circuit 15 provides a low or active PFAIL/ signal to the halt/power-down circuit 33. This low PFAIL/ is inverted by inverter 115 to develop a high PFAIL signal which, in turn, causes OR gate 117 to output an NMI or high signal to the processor 13.

Upon receiving the NMI signal from the halt/power-down circuit 33, the processor 13 branches to the interrupt service routine where it determines that PFAIL/ is low, indicating that a power failure is imminent. The processor 13 then branches into a power-down subroutine to perform housekeeping chores to prepare for power-down. This subroutine is executed by the processor 13 to save the contents of registers (not shown) in the processor 13 by putting them into predetermined locations of the battery supported DRAM 11. The processor 13 outputs a high RESCON/ (reset control) signal to the reset circuit 37 and then executes a HALT instruction. Since PFAIL/ is low, NMI will stay high and will not be influenced by the output of NOR gate 107 or the 13.5 μs output of oscillator 111. The reset circuit 37 is typically comprised of an SCR or silicon controlled rectifier (not shown) coupled across a capacitor (not shown). When triggered by the high RESCON/ signal, the SCR fires causing the reset circuit 37 to output a low RESIN/ signal to both the halt/power-down circuit 33 and to the processor 13. The function of the low RESIN/ is to hold the processor 13 reset for a short period of time while the system power supply circuit 15 is starting to go down. This gives enough time for the low RESIN/ signal to be clocked to the output of flip flop 119 on the rising edge of the next 13.5 μs clock from oscillator 111, causing PDI/ to go low and PDI to go high. The flip flop 119 will remain in this condition for the duration of the power-down condition.

It was stated before that the HALT instruction was the last instruction that the processor 13 executed during the power-down subroutine. With the execution of that HALT instruction, DATSTB/ goes high, causing the IRAS/, ROWEN/ and ICAS/ signals in FIG. 3 to go high and remain high for as long as V₁ (FIG. 2) is valid. However, when PDI (FIG. 10) goes high when RESIN/ goes low, the multiplexer 73 in FIG. 6 switches to the power-down back up inputs of BKRAS, ground, BKRAS/ and ground. These back-up inputs therefore become the driving sources for RAS/, WE/, RFSHCLK and RSTB, which will operate to keep the DRAM 11 refreshed during the power-down mode. More specifically, as shown in FIG. 6, the falling edges of the 13.5 μs clocks from the oscillator 111 (FIG. 10) will cause the one shot 81 to produce 250 ns wide pulses at its outputs, BKRAS and BKRAS/. BKRAS is passed through the multiplexer 73 onto the RAS/ line to the DRAM 11. The rising edge of BKRAS operates to refresh the row in the DRAM 11 pointed to by the refresh row address counter 35 (FIG. 7). BKRAS/ is passed through the multiplexer 73 onto the RFSHCLK line to increment the row counter 35 on the rising edge of BKRAS/ (which occurs 250 ns after the rising edge of BKRAS) in order to set up the new row address for the next RAS/ pulse (which will occur 13.5 μs minus 250 ns later).

As shown in FIG. 11, RSTB goes high (by way of inverting multiplexer 73 in FIG. 6) when DATSTB/ goes high and remains high as long as either DATSTB/ or PDI remains high. This high RSTB forces the multiplexers 89 and 91 (FIG. 7) to use the addresses from the refresh row address counter 35 (FIG. 7) to drive the row address lines (MA₀–MA₇) of the DRAM 11 for as long as a power-down situation exists.

Figure 7:
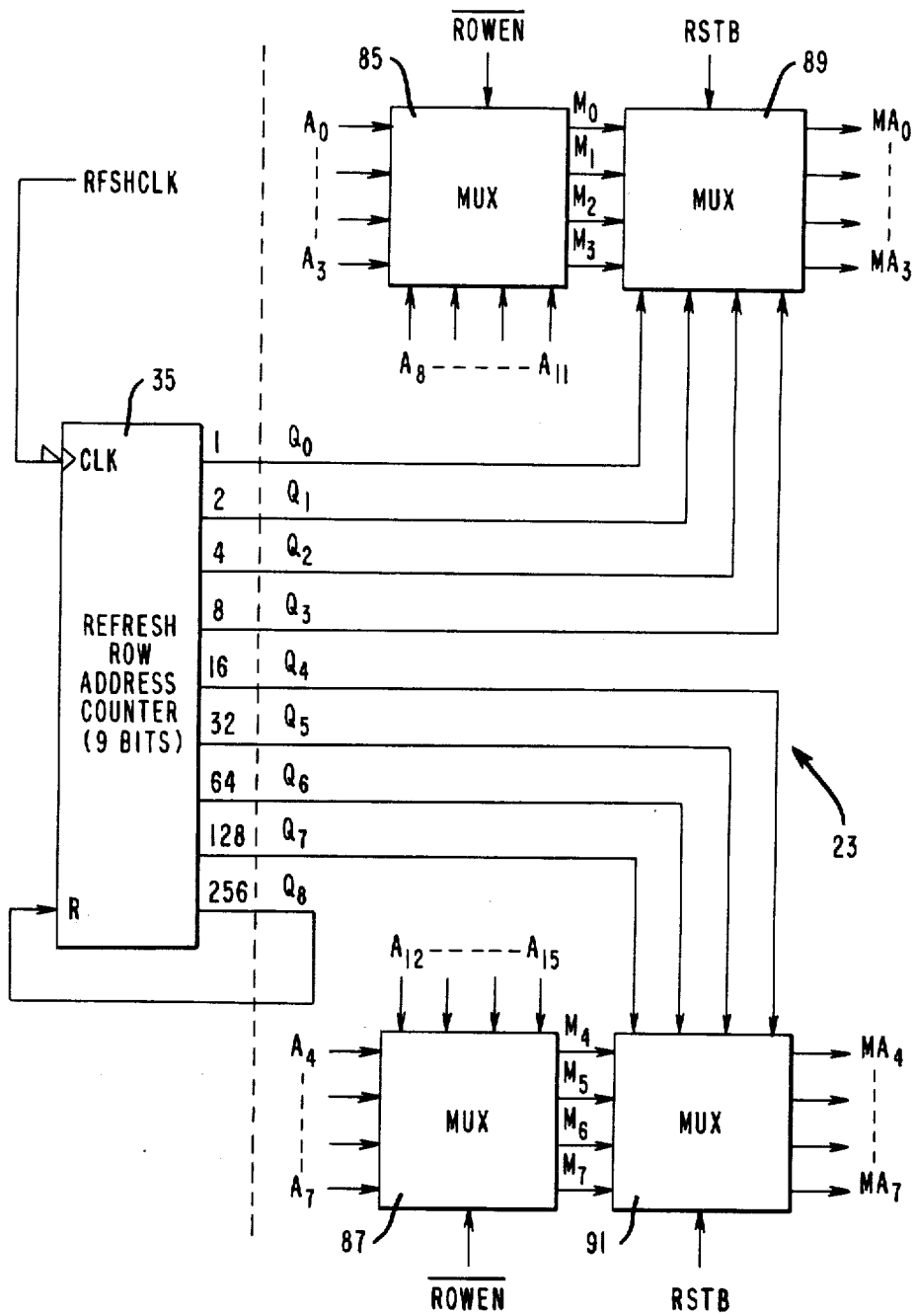
FIG. 7 is a schematic block diagram of the refresh row address counter and address and refresh multiplexer of FIG. 1.

The oscillator 111 and flip flop 119 of FIG. 10, as well as the previously mentioned multiplexer 73, one shot 81 and OR gate 83 of FIG. 6, the refresh row address counter 35 and multiplexers 89 and 1 of FIG. 7, and the DRAM 11 of FIG. 8, are all battery-supported to enable the DRAM 11 to be refreshed by the above-described operation during a power-down situation.

Power Down To Power Normal

Figure 12:
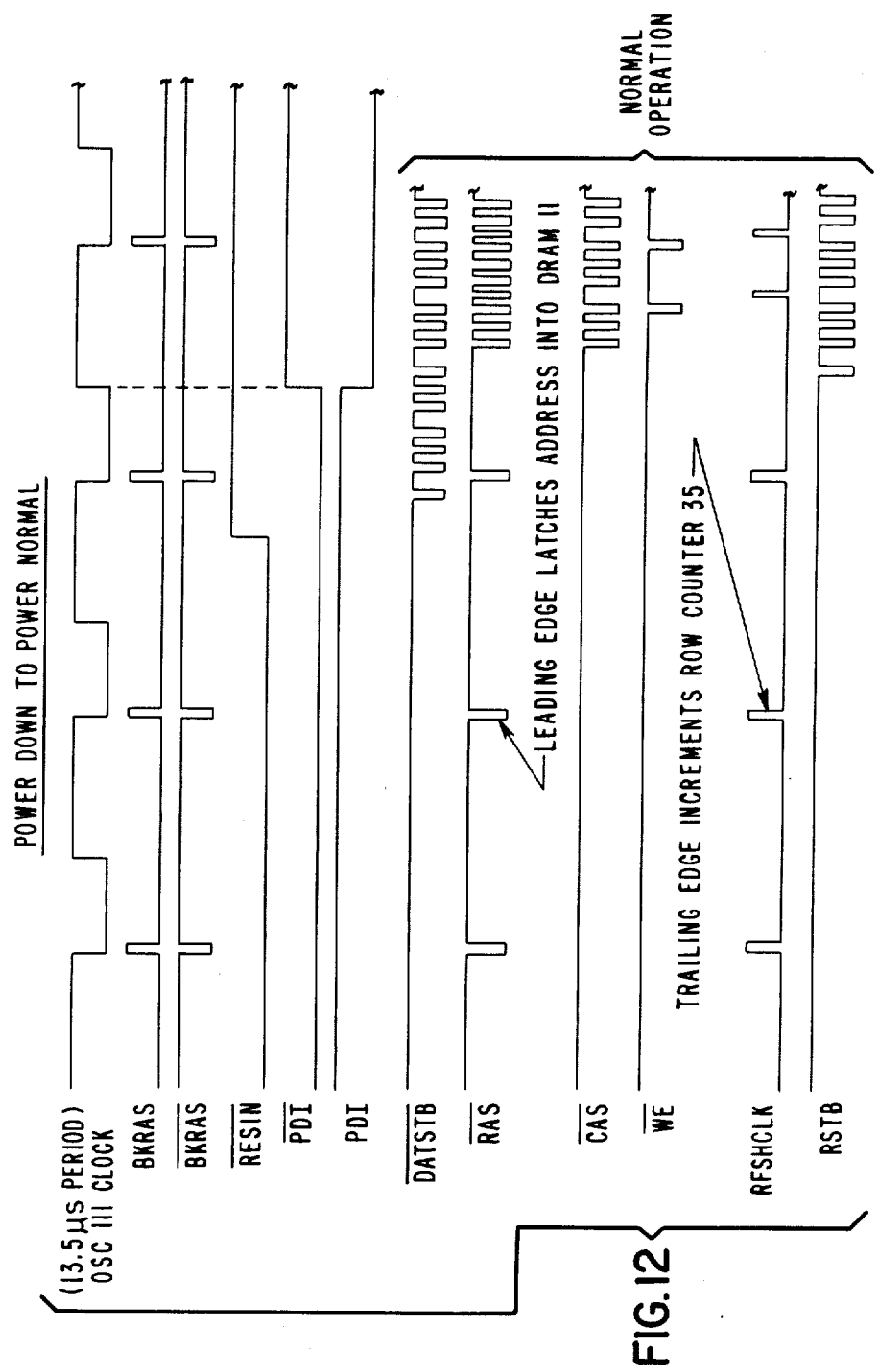

As indicated in FIG. 12, the waveforms show that the system is still in the power-down, back-up mode of operation before RESIN/ goes high. When power is restored, the PFAIL/ signal from the system power supply circuit 15 goes high. This high PFAIL/ signal is inverted by the inverter 115 to produce a low PFAIL signal which enables NOR gate 113 and OR gate 117. The high PFAIL/ signal allows the reset circuit 37 to issue a high RESIN/ signal. When RESIN/ goes high, the processor 13 begins to run and execute instructions and the DATSTB/ signal begins to operate again. Because PDI is still high at this time, indicating that the power is still down, RAS/ and RFSHCLK continue to be respectively generated by the BKRAS and BKRAS/ signals from the one shot 81 (FIG. 6). However, after RESIN/ goes high, the next rising edge of the 13.5 μs clock from the oscillator 111 latches the high RESIN/ signal into the flip flop 119, causing PDI/ to go high and PDI to go low. These states of PDI/ and PDI indicate a power-up condition.

Figure 3:
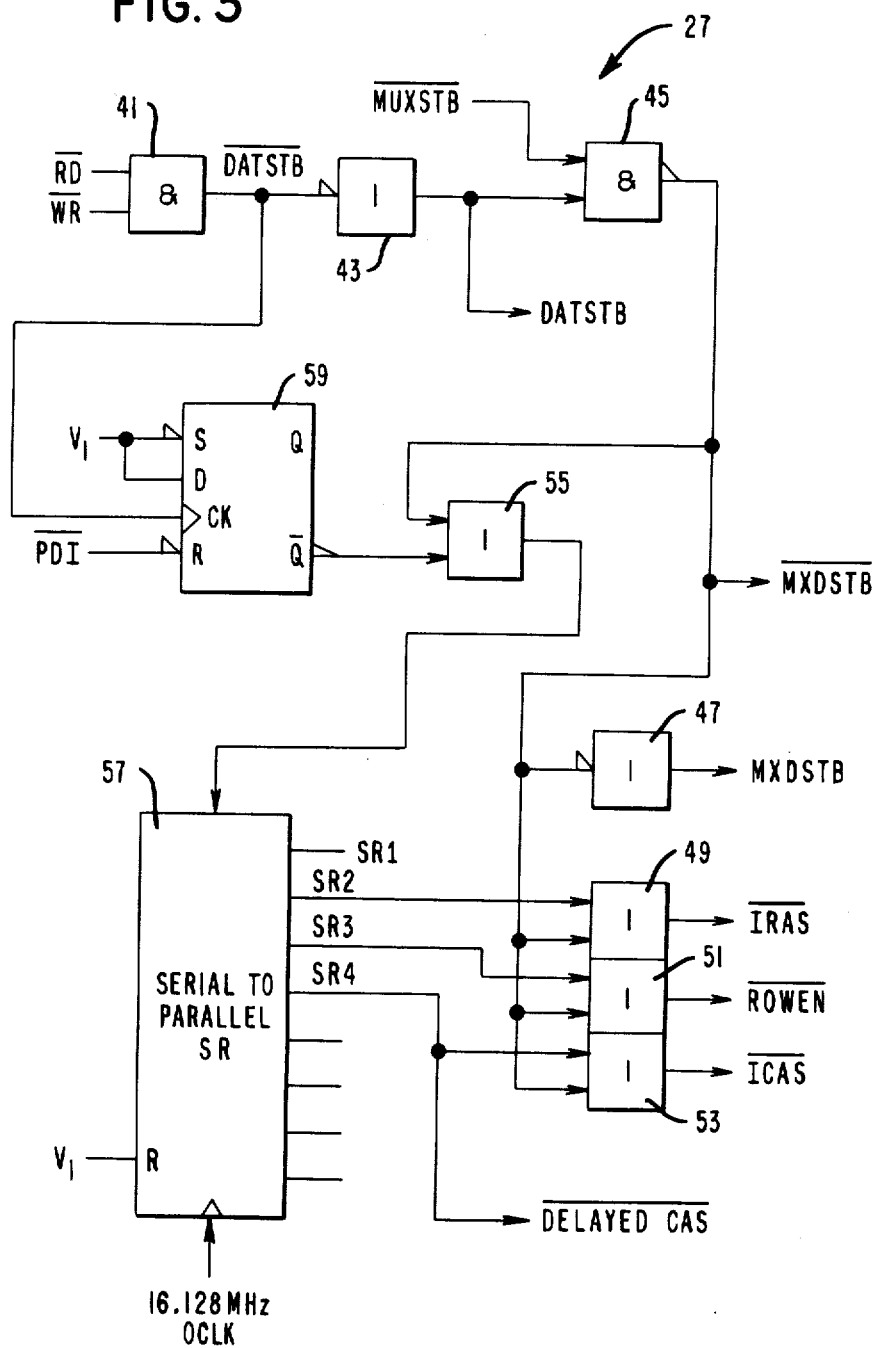
FIG. 3 is a schematic block diagram of the RAM clock generator of FIG. 1.

The first risin9 edge of DATSTB/, after PDI goes low, will clock flip flop 59 (FIG. 3) to enable OR gate 55 (FIG. 3). Subsequent DATSTB-generated MXDSTB/ signals passing through enabled OR gate 55 are then clocked through shift register 57 (FIG. 3) to initiate a memory access cycle, as discussed before.

As shown in FIG. 12, at the time PDI goes low, the system goes into its normal hidden refresh operation. The BKRAS and BKRAS/ signals which had been driving RAS/ and RFSHCLK during the power-down mode, are disconnected from the output of the multiplexer 73 (FIG. 6) by the low PDI signal. This low PDI signal causes the OR gate 83 (FIG. 6) to output ICAS/ as CAS/ and also causes the multiplexer 73 to switch from its back-up, power down inputs to its normal inputs (on the left side of the multiplexer 73) to develop the RAS/, WE/, RFSHCLK and RSTB signals, as previously discussed. Thus, it is the event of DATSTB/ going low after PDI goes low that causes the RAS/, CAS/ and WE/ signals (shown in the timing diagrams of FIG. 12) to be developed for a memory access cycle.

It is also apparent from the timing diagrams of FIG. 12 that the RSTB signal is driven by DATSTB/ after PDI goes low. The RSTB signal then drives the multiplexers 89 and 91 (FIG. 7) to pass the row and column addresses supplied from the processor 13 (FIG. 1) by way of the multiplexers 85 and 87 (FIG. 7) during the time DATSTB/ is low and to pass the row addresses from the refresh row address counter 35 (FIG. 7) during the time DATSTB/ is high.

After power is restored, the processor 13 retrieves its internal register data that it had stored in the DRAM 11 when an impending power down situation was sensed and restores that data into its internal registers.

KEEP ALIVE OPERATION

As long as the processor 13 is running and executing instructions it will be performing opcode fetch cycles, which will allow enough time for the hidden refresh operation to occur. That operation takes care of refreshing one row at a time throughout the DRAM 11 to keep that memory valid. However, each of several logic analyzers and test equipments currently on the market that may be used during software development or testing, for example, has a feature wherein it can wait for a particular instruction to be executed and then stop a microprocessor (or processor) and hold it in an inactive state. Such an eventuality would be disastrous when a dynamic RAM 11 is being used with the processor 13, since a refresh operation is required to maintain the integrity of the dynamic RAM 11. If the processor 13 stopped running or processing data, the refresh operation for the dynamic RAM 11 would stop and after about 4 ms the integrity of the data stored in the dynamic RAM 11 would be invalid.

Figure 13:
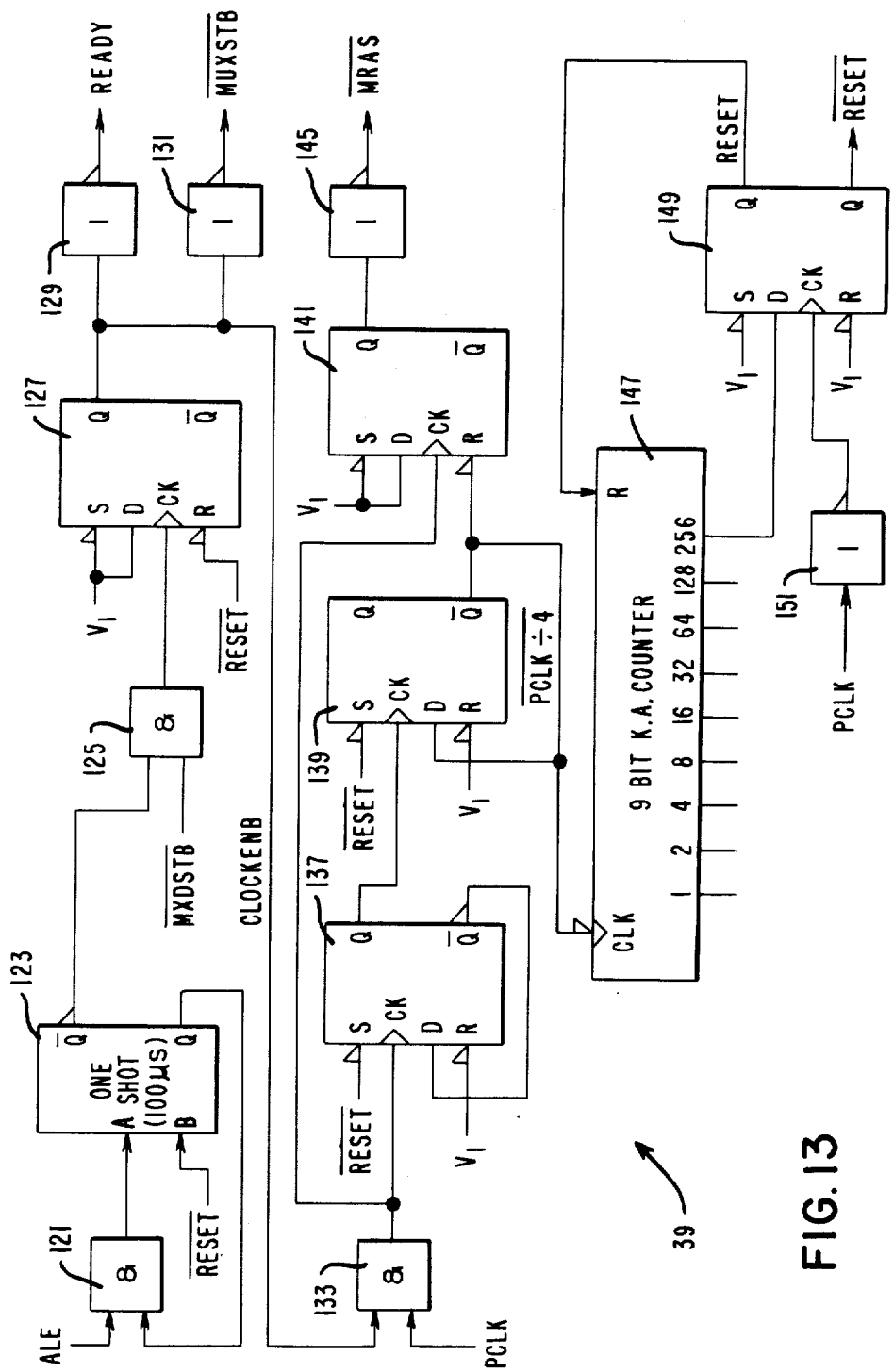
FIG. 13 is a schematic block diagram of the keep-alive circuit of FIG. 1.

It is to prevent such a result that the keep alive circuit 39 of FIG. 13 is used. Basically, the keep alive circuit 39 senses when the processor 13 has stopped running or processing for a given exemplary time period of 100 μs. After this 100 μs period times out or expires, the keep alive circuit 39 operates to provide a periodic refresh of all of the rows in the DRAM 11 before turning the DRAM 11 back over to the processor 13. In the event that the logic analyzer or test equipment has not re-enabled the processor 13 to allow it to run again before the 100 μs period times out again, the keep alive circuit 39 will once again periodically refresh all of the rows in the DRAM 11 before turning the DRAM 11 back over to the processor 13. In the event that the logic analyzer or test equipment has re-enabled the processo 13 to allow it to run again before the 100 μs period times out, a normal hidden refresh operation occurs to refresh the DRAM 11 one row at a time for each opcode fetch cycle decoded by the hidden refresh circuit 29 (FIG. 5).

To explain the keep alive operation more fully, the waveforms of FIG. 14 will also be referred to in conjunction with the description of the keep alive circuit 39 of FIG. 13.

In the normal operation of the keep alive circuit 39, the high address latch enable (ALE) pulse from the processor 13 occurs once during each machine cycle (or instruction) of the processor 13. That ALE pulse is passed through AND gate 121 to the A-input of one-shot 123. Every time an ALE pulse occurs, the one-shot 123 is retriggered to cause its Q/ output to be low and its Q output to be high. That high Q output is fed back to enable the AND gate to pass the next ALE pulse.

The one-shot 123 has an exemplary 100 μs time out period before it can return to its quiescent condition where its Q/ and Q outputs would be high and low, respectively. However, each time that an ALE pulse occurs, the one-shot 123 is retriggered and will not time out as long as the processor 13 is running normally. In this event, the keep alive circuit 39 does nothing and remains in its triggered condition.

However, if the processor 13 stops running due to the use of a logic analyzer or other piece of test equipment in the system, the processor 13 will no longer generate ALE pulses. Consequently, the one-shot 123 will time out at time $t_0$ (FIG. 14), 100 μs after the last ALE pulse was generated by the processor 13. When the one-shot 123 times out, its Q output goes low to disable AND gate 121 and its Q/ output goes high.

The high Q/ output of the one shot 123 is applied to an upper input of AND gate 125. The signal MXDSTB/ from the RAM clock generator 27 (FIG. 3) is applied to the lower input of AND gate 125. It will be recalled that, in the discussion of the RAM clock generator 27 (FIG. 3), both DATSTB/ and MXDSTB/ go high and/or remain high when the processor 13 stops processing or running since no low RD/ or low WR/ signal is generated by the processor 13. As a result, when the one shot 123 times out, the output of the AND gate 125 goes high. This high transition of the output of AND gate 125 clocks flip flop 127, causing the high level at the data input of the flip flop 127 to be clocked to the output of the flip flop 127 as a high CLOCKENB (clock enable) signal. This high CLOCKENB signal is inverted by inverters 129 and 131 to respectively develop low READY and low MUXSTB/ signals. Having READY in its low state will further disable the processor 13 so that the processor 13 remains inactive during the ensuing keep alive cycle, even if the logic analyzer or piece of test equipment re-enables the processor 13 and allows it to run prior to the completion of the keep alive cycle. The low MUXSTB/ signal is fed back to the NAND gate 45 in FIG. 3, causing the resultant high MXDSTB/ signal from NAND gate 45 to disable OR gates 49, 51 and 53 to force IRAS/, ROWEN/ and ICAS/ to remain in their inactive or high states, as shown in FIG. 3. Thus, as long as MXDSTB/ is low, a memory access cycle cannot begin even if the processor 13 is re-enabled by the test equipment.

The high CLOCKENB signal also enables AND gate 133 to pass PCLKs to the clock input of a divide-by-four network 135 during the period ($t_1$–$t_3$) of a keep alive cycle. As shown in FIG. 14, the PCLKs which occur during the keep alive period of $t_1$–$t_3$ comprise 256 consecutive groups of PCLKs, with each group being comprised of PCLKs 1, 2, 3 and 4. The operation of the keep alive circuit 39 repeats for each of these groups.

The divide by-four network 135 includes D flip flops 137 and 139. Each of the flip flops 137 and 139 has its Q/ output connected to its data input (D) to determine its next Q output state). Each of these flip flops 137 and 139 has been previously set by a prior low RESET/ signal (to be explained) and remains in that set condition until PCLKs start passing through now enabled AND gate 133 to the clock input of flip flop 137. The output of the network 135 is taken from the Q/ side of flip flop 139. This output is the logical inversion of PCLK ÷ 4 and is designated as PCLK ÷ 4/.

The rising edge of PCLK 1 clocks flip flop 137 to cause its Q output to go low. The rising edge of PCLK 2 clocks flip flop 137 to cause its Q output to go high. This high going edge at the Q output of flip flop 137 clocks flip flop 139 to cause PCLK ÷ 4/ to go high and remove the low reset condition from flip flop 141.

The rising edge of PCLK 3 not only clocks flip flop 137 to cause its Q output to go low, but also clocks out the high level at the data input of flip flop 141. This high going output of flip flop 141 is inverted by inverter 145 to initiate an MRAS/ pulse by causing MRAS/ to go low.

The rising edge of PCLK 4 clocks flip flop 137 to cause its Q output to go high again. This high going edge at the Q output of flip flop 137 clocks flip flop 139 to cause PCLK ÷ 4/ to go low and reset flip flop 141 to a low Q output. This low going output of flip flop 141 is inverted by inverter 145 to terminate the MRAS/ pulse by causing MRAS/ to return high.

Each subsequent group of PCLKs 1–4 that occur during a keep alive cycle (from $t_1$ to $t_3$), causes the keep alive circuit 39 to repeat the above-described operation to generate an associated MRAS/ pulse. Thus, an MRAS/ pulse is generated during the period of each PCLK÷4/ signal developed at the output of the flip flop 139. In addition, 256 MRAS/ pulses are generated during a keep alive cycle time between $t_1$ and $t_3$.

As shown in FIG. 14, each MRAS/ pulse goes low with the rising edge of PCLK 3 and returns high with the rising edge of PCLK 4. This operation provides for three PCLK cycle times (PCLK 4, PCLK 1 and PCLK 2) of precharge time for circuit stabilization before the following MRAS/ pulse refreshes the next row in the DRAM 11.

The falling edge of each PCLK÷4/ (which occurs on the rising edge of PCLK 4) increments a 9-bit keep alive counter 147 by one. The counter 147 is a modulo 255 counter which counts from 0 through 255 before returning to 0. When the counter 147 has counted 256 PCLK÷4/ clocks, it will produce a high state signal on its 256 output at time $t_2$. This high state signal is applied to the data input of flip flop 149. The flip flop 149 also receives at its clock input PCLKs that have been logically inverted by inverter 151.

At time $t_3$, after the data input of flip flop 149 goes high at time $t_2$, the next falling edge of PCLK 4 clocks that high data input out of the flip flop 149 to provide high RESET and low RESET/ outputs. The low RESET/ resets flip flop 127 to a low Q output, sets each of the flip flops 137 and 139 to a high Q output, and retriggers the one-shot 123 by way of its B input. The high RESET resets the counter 147 to 0, causing its 256 output to apply a low signal to the data input of flip flop 149. At time $t_4$, the falling edge of the next PCLK clocks that low data input out of the flip flop 149 to provide low RESET and high RESET/ outputs. This enables the keep alive circuit 39 to repeat its generation of 256 consecutive MRAS/ pulses the next time that the one-shot 123 times out.

During the period $t_1$-$t_3$ of a keep alive cycle, 256 consecutive MRAS/ pulses are generated. These 256 MRAS/ pulses are utilized in the previously discussed circuitry of FIGS. 5-8 to produce 256 RFSHCLK clocks to sequentially increment the refresh row address counter 35 (FIG. 7) and 256 MRAS/ pulses to sequentially refresh the 256 rows of the DRAM 11 as the counter 35 steps through its 256 addresses. Basically, it is the falling edge of each MRAS/ pulse which ultimately causes the refreshing of an associated row of memory in the DRAM 11 and the rising edge of each MRAS/ pulse which causes the refresh row address counter 35 to be incremented to the address of the next row in the DRAM 11 that is to be refreshed.

At time $t_3$, when the flip flop 127 is reset by a low RESET/ signal to a low Q output, the inverters 129 and 131 will respectively output high READY and high MUXSTB/ signals. The high READY signal will re-enable the processor 13. If the processor 13 has been re-enabled by the logic analyzer or piece of test equipment by this time, the processor 13 will start generating ALE pulses again. Since the one-shot 123 has been retriggered at time $t_3$ by the low RESET/ signal, these ALE pulses will hold the one-shot 123 in a triggered condition and normal system operation with hidden refresh will occur. However, if the logic analyzer or test equipment has not released the processor 13, then no ALE pulses will be generated and the one-shot 123 will time out again in the exemplary 100 µs. When the one-shot 123 times out again, the keep alive circuit 39 will begin anew to cause another refreshing operation of all of the rows in the DRAM 11.

The invention thus provides a system and method for providing a hidden refresh operation on a dynamic RAM 11 when the microprocessor or processor 13 is normally executing instructions and for providing selective refresh operations on the dynamic RAM 11 when the processor 13 is in a halt condition, in a power-down condition, or not running due to the use of a logic analyzer or test equipment.

While the salient features of the invention have been illustrated and described, it should be readily apparent to those skilled in the art that many changes and modifications can be made in the system and method of the invention presented without departing from the spirit and true scope of the invention. Accordingly, the present invention should be considered as encompassing all such changes and modifications of the invention that fall within the broad scope of the invention as defined by the appended claims.

We claim:

1. In a data processing system including a data processor outputting first and second status signals, first and second operating control signals, first clock signals and first memory address signals, a memory system comprising;

a dynamic random access memory coupled to said processor for receiving said first memory address signals;

generator means coupled to said data processor for generating first and second timing signals in response to receiving said first operating control signals;

first gating means coupled to said data processor for outputting an opcode fetch signal in response to receiving said first and second status signals;

a plurality of bistable devices coupled to said generator means and said first gating means for generating a first control signal in response to receiving said opcode fetch signal and said first timing signals;

first logic circuit means coupled to said bistable devices for outputting a first refresh signal in response to the generation of said first control signal;

first multiplexer means coupled to said first logic circuit means, said generator means and said memory for outputting a second refresh signal, an address clock signal and first and second select signals in response to the outputting of said first refresh signal and the generation of said second timing signals to refresh one of a plurality of predetermined portions of said memory identified by the first memory address signals during an opcode fetch cycle of each instruction being executed by said processor;

counter means coupled to said first multiplexer means for developing second memory address signals in response to the outputting of said address clock signal;

second multiplexer means coupled to said counter means, said processor, said generator means and said first multiplexer means for transmitting the second memory address signals to said memory so that at the time of the generation of the next second refresh signal, a refresh operation can be performed on that portion of said memory identified by the second memory address signals in response to the outputting of said first select signal and for selecting address signals from said processor to enable read-write operations to be performed on data in said memory in response to the outputting of said second select signal;

a first one-shot circuit coupled to said processor for outputting a second control signal upon the elapsing of a predetermined time period, said one-shot circuit being disabled from operation, said one-shot circuit being disabled from operation in response to receiving said second operating control signal; and second logic circuit means coupled to said first logic circuit means, said one-shot circuit and said processor for outputting a plurality of third control signals to said first logic circuit means in response to the outputting of said second control signal and said first clock signals enabling said first logic circuit means to output said first refresh signal to said first multiplexer means whereby the first multiplexer means will output a plurality of said second refresh signals and an associated sequence of address clock signals to the memory causing all of the portions in said memory to be sequentially refreshed upon failure of the processors to start processing before the expiration of said predetermined time period.

2. The system of claim 1 in which said first logic circuit means includes a second one-shot circuit coupled to said bistable devices and operated to output a refresh control signal in response to the generation of said first control signal, said first logic circuit means further including second gating means coupled to said second one-shot circuit and said second logic circuit means for outputting said first refresh signal to said first multiplexer means in response to receiving said third control signals or said refresh control signal.

3. The system of claim 2 which further includes a third one-shot circuit coupled to said first multiplexer means for outputting control pulses, when enabled, to said first multiplexer means allowing the first multiplexer means to output said second refresh signals and address clock signal when enabled, and oscillating means coupled to said third one-shot circuit and a second bistable device for outputting a plurality of second clock signals to said third one-shot circuit enabling said third one-shot circuit, said second bistable device being coupled to said first multiplexer means and operated in response to receiving said second clock signals and to an impending power failure of said processor to output a power-down signal to said first multiplexer means enabling said first multiplexer means to output said control pulses for refreshing the memory until after power is restored to said processor.

* * * * *